(12) United States Patent
Umeda et al.

(10) Patent No.: US 7,511,539 B2
(45) Date of Patent: *Mar. 31, 2009

(54) DRIVER CIRCUIT

(75) Inventors: Yohtaro Umeda, Kanagawa (JP);
Atsushi Kanda, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/657,495

(22) Filed: Jan. 23, 2007

(65) Prior Publication Data
US 2007/0120589 A1 May 31, 2007

Related U.S. Application Data

(63) Continuation of application No. 10/636,381, filed on Aug. 6, 2003, now Pat. No. 7,187,227.

(30) Foreign Application Priority Data
Aug. 7, 2002 (JP) .............................. 2002-230452

(51) Int. Cl.
*H03K 3/00* (2006.01)
(52) U.S. Cl. ...................................... 327/108; 327/112
(58) Field of Classification Search ........................ None
See application file for complete search history.

(56) References Cited

U.S. PATENT DOCUMENTS

| 4,021,747 A | 5/1977 | Todokoro |
| 4,395,644 A | 7/1983 | Misaizu |
| 4,518,873 A | 5/1985 | Suzuki et al. |
| 4,540,904 A | 9/1985 | Ennis et al. |
| 4,553,045 A | 11/1985 | Murotani |
| 4,952,885 A * | 8/1990 | Devecchi et al. ............ 330/277 |
| 5,153,450 A * | 10/1992 | Ruetz .......................... 326/87 |
| 5,694,065 A | 12/1997 | Hamasaki |

(Continued)

FOREIGN PATENT DOCUMENTS

JP          55-107337          8/1980

(Continued)

OTHER PUBLICATIONS

Dean, "Transistors—Theory and Circuitry", pp. 90-92, McGraw Hill Publishing Company, Ltd., 1964.

*Primary Examiner*—Cassandra Cox
(74) *Attorney, Agent, or Firm*—Blakely, Sokoloff, Taylor & Zafman LLP

(57) ABSTRACT

A driver circuit includes first and second three-terminal active elements, and first and second delay units. The first and second three-terminal active elements are series-connected. Each of the first and second three-terminal active elements has an amplification function and first, second, and third electrodes. The second and third electrodes of each three-terminal active element are series-connected between the first and second potentials. The first and second delay units receive the same input signal. The outputs of the first and second delay units are respectively connected to the first electrodes of the first and second three-terminal active elements. The delay amount of the second delay unit is larger than that of the first delay unit. The delay amount of the first delay unit is a finite value including zero.

3 Claims, 14 Drawing Sheets

U.S. PATENT DOCUMENTS

| | | | | |
|---|---|---|---|---|
| 5,719,379 A | * | 2/1998 | Huang et al. | 219/502 |
| 5,963,076 A | | 10/1999 | Shor et al. | |
| 6,118,324 A | * | 9/2000 | Li et al. | 327/384 |
| 6,445,224 B1 | * | 9/2002 | Fong | 327/108 |
| 6,448,813 B2 | * | 9/2002 | Garlepp et al. | 326/83 |
| 6,590,421 B2 | * | 7/2003 | Chung et al. | 326/83 |
| 6,917,227 B1 | * | 7/2005 | Ochi | 327/111 |
| 2002/0067198 A1 | | 6/2002 | Schneider et al. | |

FOREIGN PATENT DOCUMENTS

| | | |
|---|---|---|
| JP | 60141020 | 7/1985 |
| JP | 03-073917 | 3/1991 |
| JP | 2000-036731 | 2/2000 |
| JP | 2000-091905 | 3/2000 |

* cited by examiner

DRIVER CIRCUIT

The present patent application is a Continuation of application Ser. No. 10/636,381, filed Aug. 6, 2003 now U.S. Pat. No. 7,187,227.

BACKGROUND OF THE INVENTION

The present invention relates to a driver circuit using a transistor and, more particularly, to a driver circuit capable of a large-amplitude output at a high speed.

The implementation of a wide-band, high-output amplifier capable of DC high-speed operation and large-amplitude driving has been expected as semiconductor integrated circuits for optical modulator driver, laser driver, and large-amplitude logical interface output. Also, the implementation of a high-speed, high-output amplifier capable of high-frequency operation and large-amplitude driving has been expected as a power amplifier for a wireless system. The present invention relates to a circuit arrangement which implements such amplifier.

FIG. 15 shows the arrangement of the output stage of a conventional driver circuit using a field effect transistor (to be referred to as an FET hereinafter) with a source-grounded circuit. Reference symbol GND denotes ground; Vdd, a positive power supply voltage; Vin, an input signal voltage; Vout, an output signal voltage; T1, an FET; and R1 a resistor.

Reference symbol Vds denotes a voltage of the drain of the FET to the source; and Vdsmax and Vdsmin, maximum and minimum design values of Vds. Letting Vdsbd be the positive breakdown voltage of the drain of the FET to the source, Vdsmax<Vdsbd must be established. Letting Vgd be the voltage of the gate to the drain, Vgdmax and Vgdmin be the maximum and minimum design values of Vgd, and Vgdbd be the negative breakdown voltage of the gate of the FET to the drain, Vgdmin>Vgdbd must be established.

In the prior art, a change Vdsmax-Vdsmin in Vds of one FET is extracted as an output amplitude on the output stage of the driver circuit in the source-grounded circuit. That is, Vout having an amplitude larger than Vdsmax-Vdsmin cannot be output. This also applies to an emitter-grounded circuit using a bipolar transistor.

According to Japanese Patent Laid-Open No. 3-73917 (FIG. 5 of this reference), the power supply bias is properly set. When a gate-source voltage Vgs is set to a high level Vgsmax for both two series-connected FETs on the output stage, a drain-source voltage Vds can be set to a low level Vdsmin. When Vgs is set to a low level Vgsmin, Vds can be set to a high level Vdsmax. When an input signal is sufficiently low in speed, the total voltage applied to the two series-connected transistors can be equally divided by the two transistors, and a signal having an amplitude twice an amplitude outputtable by one transistor can be output.

FIG. 16 shows the arrangement of the output stage of a driver circuit disclosed in Japanese Patent Laid-Open No. 3-73917. In this arrangement, transistors T1 and T2 are series-connected between a power supply voltage Vdd and ground GND. An input signal voltage Vin is simultaneously applied to the gate electrodes of the transistors (FETs) T1 and T2.

In the technique disclosed in Japanese Patent Laid-Open No. 3-73917, the driving timings of the gate electrodes of the two FETs basically coincide with each other. If a high-speed signal is input, the voltage balance between the two FETs is lost, and the voltage readily exceeds the breakdown voltage of the transistor.

[Reason That Voltage Readily Exceeds Breakdown Voltage]

Letting τ be the delay time of an inverter formed from one transistor, the rise and fall times unique to the inverter are given by 2τ. Assume that a high-speed signal corresponding to the rise/fall time 2τ is input. When the two series-connected transistors T1 and T2 change from OFF to ON, a gate voltage Vg1 of the lower transistor T1 changes from low level (Vg1off) to high level (Vg1on) (FIG. 17A). Vds of the transistor T1 changes from Vdsmax to Vdsmin after the delay time τ of the transistor T1 (FIG. 17B).

This means that a source potential Vs2 (FIG. 17B) of the transistor T2 changes from high level Vs2max=Vdsmax to Vs2min=Vdsmin at a time τ after a gate voltage Vg2 (FIG. 17C) of the upper transistor T2 changes from high level to low level.

Owing to the delay of Vs2 from Vg2, a large negative undershoot occurs in a gate-source voltage Vgs2 of the transistor T2, as shown in FIG. 17D. The time when the gate-source voltage of the transistor T2 changes from OFF to ON delays by almost 2τ from the time of the transistor T1.

As a result, the voltage division balance in drain-source voltage between the transistors T1 and T2 is greatly lost in changing from OFF to ON. As shown in FIGS. 17E and 17F, large undershoots occur in a drain-source voltage Vds2 and gate-drain voltage Vgd2 of the transistor T2. The voltage readily exceeds the breakdown voltage.

Note that an undershoot means a spike which occurs in a direction opposite to a change at the beginning of the change. An overshoot means a spike which occurs in the same direction as a change at the end of the change.

SUMMARY OF THE INVENTION

It is a principal object of the present invention to provide a driver circuit capable of high-speed operation corresponding to an input signal in the use of series-connected three-terminal active elements.

To achieve the above object, according to the present invention, there is provided a driver circuit comprising first and second series-connected three-terminal active elements, each of the first and second three-terminal active elements having an amplification function and first, second, and third electrodes, the second and third electrodes of each three-terminal active element being series-connected between first and second potentials, and first and second delay means which receive the same input signal, wherein outputs of the first and second delay means are respectively connected to the first electrodes of the first and second three-terminal active elements, a delay amount of the second delay means is larger than a delay amount of the first delay means, and the delay amount of the first delay means is a finite value including zero.

According to the present invention, the output of the first delay means is connected to the first electrode of the first three-terminal active element. The output of the second delay means is connected to the first electrode of the second three-terminal active element. The delay amount of the second delay means is set larger than that of the first delay means, and the delay amount of the first delay means is set to a finite value including zero. The driving timing of the first electrode of the second three-terminal active element delays from that of the first electrode of the first three-terminal active element. When a high-speed signal is input, the voltage balance is hardly lost between the two three-terminal active elements. Undershoots in the voltage between the second and third electrodes and the voltage between the third and second electrodes of the second three-terminal active element are reduced. The voltages hardly exceed the breakdown voltages.

DESCRIPTION OF THE PREFERRED EMBODIMENT

Figure 1:
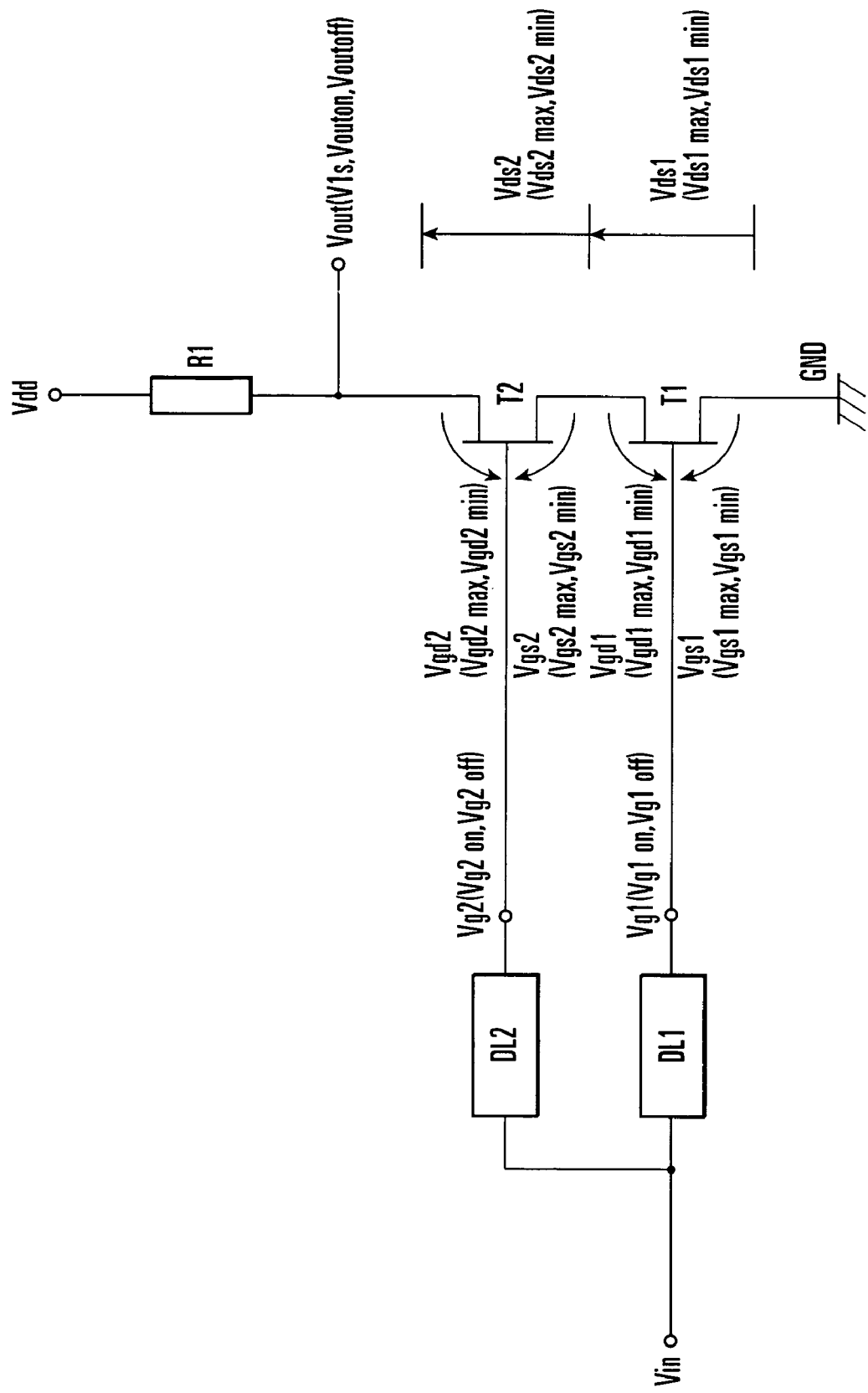
FIG. 1 is a circuit diagram showing the main part of a driver circuit according to an embodiment of the present invention.

FIG. 1 shows the main part of a driver circuit according to an embodiment of the present invention. The circuit shown in FIG. 1 is an arrangement example of an output stage on which two FETs are series-connected. Reference symbols T1 and T2 denote transistors (FETs); DL1 and DL2, delay means; R1, a resistor; GND, ground; Vdd, a positive power supply voltage; Vg1 and Vg2, gate voltages of the transistors T1 and T2 to ground; Vgs1 and Vgs2, gate voltages Vgs of the transistors T1 and T2 to the sources; Vgd1 and Vgd2, gate voltages Vgd of the transistors T1 and T2 to the drains; Vds1 and Vds2, drain voltages Vds of the transistors T1 and T2 to the sources; Vout, an output signal voltage; and Vin, an input signal voltage.

The delay means DL1 and DL2 receive the same input signal voltage Vin, and their outputs are respectively connected to the gates of the transistors T1 and T2. The delay amount of the delay means DL2 is set larger than that of the delay means DL1, and the delay amount of the delay means DL1 is a finite value including zero (delay amount≧0).

Reference symbol V1s denotes an output logic amplitude at Vout; Vds1max and Vds2max, maximum design values of Vds which correspond to the OFF states of the transistors T1 and T2; Vds1min and Vds2min, minimum design values of Vds that correspond to the ON states of the transistors T1 and T2; Vgs1max and Vgs2max, maximum design values of Vgs that correspond to the ON states of the transistors T1 and T2; Vgs1min and Vgs2min, minimum design values of Vgs that correspond to the OFF states of the transistors T1 and T2; Vgd1max and Vgd2max, maximum design values of Vgd that correspond to the ON states of the transistors T1 and T2; Vgd1min and Vgd2min, minimum design values of Vgd that correspond to the OFF states of the transistors T1 and T2; Vg1on and Vg2on, lower limit values of the gate voltages Vg necessary to turn on the transistors T1 and T2; Vg1off and Vg2off, upper limit values of Vg necessary to turn off the transistors T1 and T2; Vouton, a Vout value corresponding to the simultaneous ON state of the transistors T1 and T2; and Voutoff, a Vout value corresponding to the simultaneous OFF state of the transistors T1 and T2.

Letting Vdsbd be the positive breakdown voltage of the drain of the FET to the source, Vgdbd be the negative breakdown voltage of the gate to the drain, and Vgd1min and Vgd2min be the minimum voltage values (negative values) of the gates of the transistors T1 and T2 to the drains, Vds1max<Vdsbd Vds2max<Vdsbd Vgd1min=Vgs1min−Vds1max>Vgdbd Vgd2min=Vgs2min−Vds2max>Vgdbd must be established.

Figure 2A:
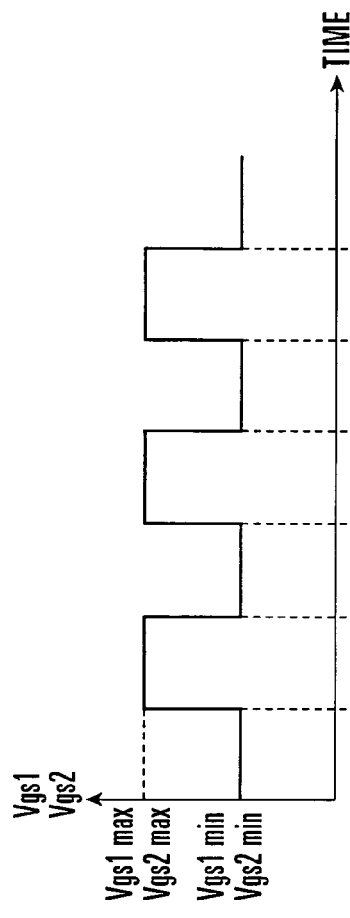
FIGS. 2A to 2C are waveform charts showing the waveforms of respective portions in the driver circuit.
Figure 2B:
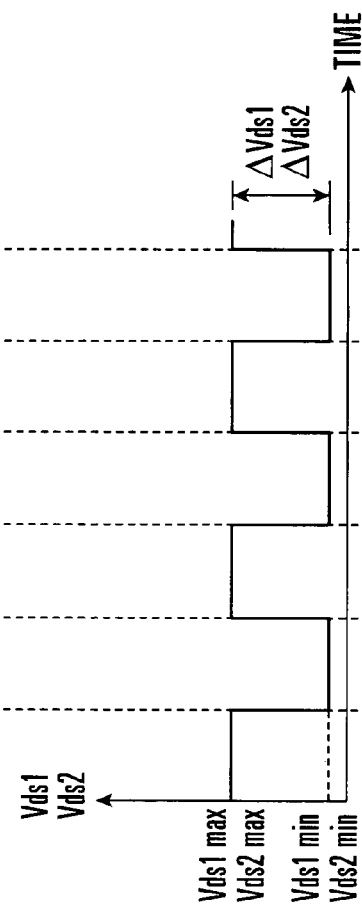
Figure 2C:
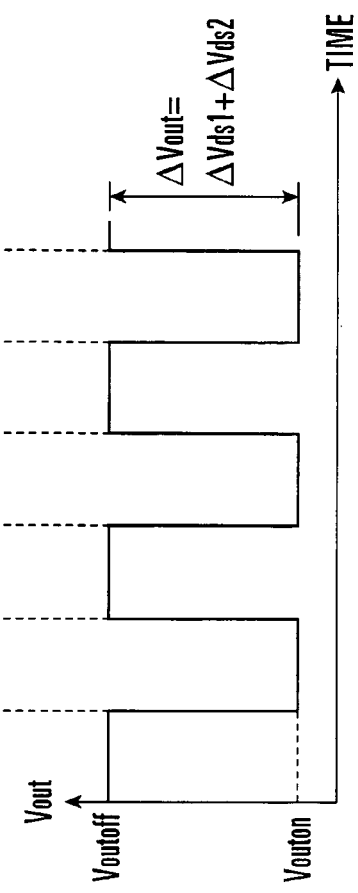

Control signals having the same voltage are input to Vgs1 and Vgs2 with a waveform as shown in FIG. 2A so as to simultaneously turn on or off the transistors T1 and T2. At this time, the voltages Vds of the transistors T1 and T2 respond with Vds1max and Vds2max as upper limits and Vds1min and Vds2min as lower limits, as shown in FIG. 2B (the phase is opposite between FIGS. 2A and 2B). Since Vds1 and Vds2 change in synchronism with each other, Voutoff=Vds1max+Vds2max Vouton=Vds1min+Vds2min An amplitude ΔVout of an output signal voltage extracted from the drain terminal of the second transistor T2 is defined by ΔVds1=Vds1max−Vds1min ΔVds2=Vds2max−Vds2min As shown in FIG. 2C, the amplitude ΔVout is given by ΔVout=ΔVds1+ΔVds2

In this circuit arrangement, the power supply bias is properly set. When the gate-source voltage Vgs is set to a high level Vgsmax for both the two series-connected transistors T1 and T2 on the output stage, the drain-source voltage Vds can be set to a low level Vdsmin. When Vgs is set to a low level Vgsmin, Vds can be set to a high level Vdsmax. This is similar to the technique disclosed in Japanese Patent Laid-Open No. 3-73917.

Similar to the technique disclosed in Japanese Patent Laid-Open No. 3-73917, when an input signal is sufficiently low in speed, the total voltage applied to the two series-connected transistors can be equally divided by the two transistors, and a signal having an amplitude twice an amplitude outputtable by one transistor can be output. However, in this embodiment, unlike the technique disclosed in Japanese Patent Laid-Open No. 3-73917, the driving timing is delayed for the gate electrode of the upper transistor T2. Even if a high-speed signal is input, the voltage balance between the transistors T1 and T2 is hardly lost, and the transistors hardly exceed their breakdown voltages.

[Reason That Transistor Hardly Exceeds Breakdown Voltage]

Letting τ be the delay time of an inverter formed from one transistor, the rise and fall times unique to the inverter are given by 2τ. Assume that a high-speed signal corresponding to the rise/fall time 2τ is input to the gate of the transistor T2 with a delay τ from the transistor T1 by proper delay means DL1 and DL2.

Figure 3A:
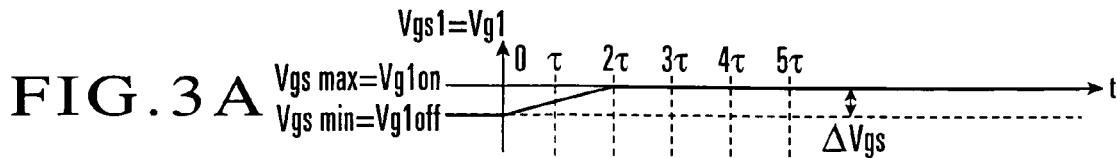
FIGS. 3A to 3F are waveform charts showing high-speed operation in the driver circuit.
Figure 3B:
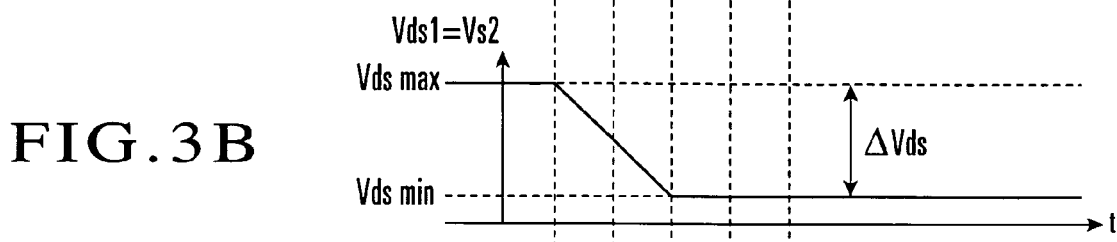

When the two series-connected transistors T1 and T2 change from OFF to ON, the gate voltage Vg1 of the lower transistor T1 changes from low level (Vg1off) to high level (Vg1on) (FIG. 3A), and Vds of the transistor T1 changes from Vdsmax to Vdsmin after the switching time τ of the transistor T1 (FIG. 3B).

Figure 3C:
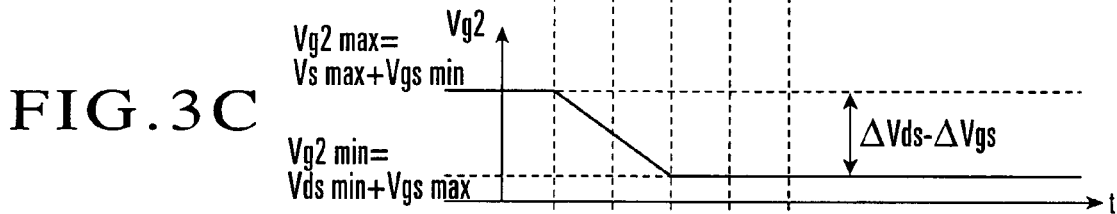

The time when the gate potential Vg2 (FIG. 3C) of the upper transistor T2 changes from high level to low level has the delay τ from the time when a signal input to the transistor T1. The change time coincides with the time when the source potential Vs2 (FIG. 3B) of the transistor T2 changes from high level Vs2max=Vdsmax to Vs2min=Vdsmin.

Figure 3D:
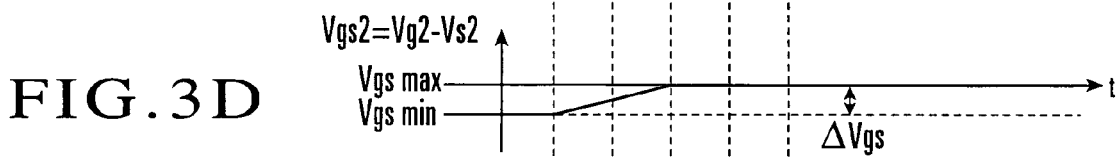

Because the change times of Vs2 and Vg2 coincide with each other, no undershoot occurs in the gate-source voltage Vgs2 of the transistor T2, as shown in FIG. 3D. The delay of the time when the transistor T2 changes from OFF to ON from the time when the transistor T1 changes from OFF to ON is τ which is almost half of the time in Japanese Patent Laid-Open No. 3-73917.

Figure 3E:
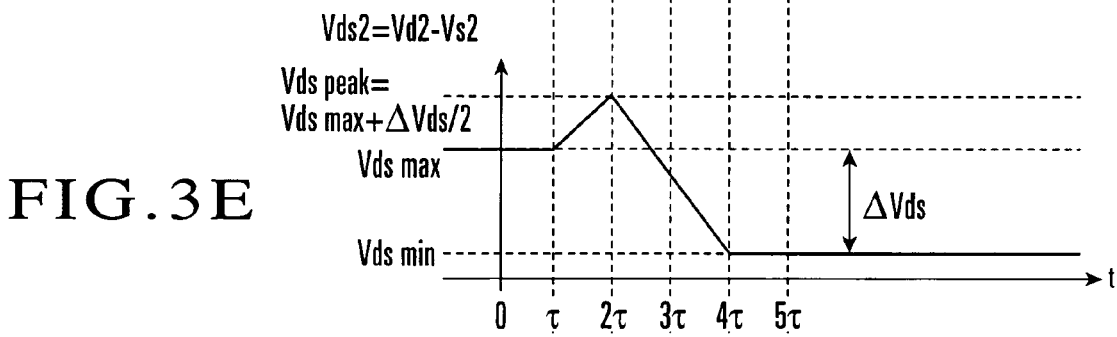
Figure 3F:
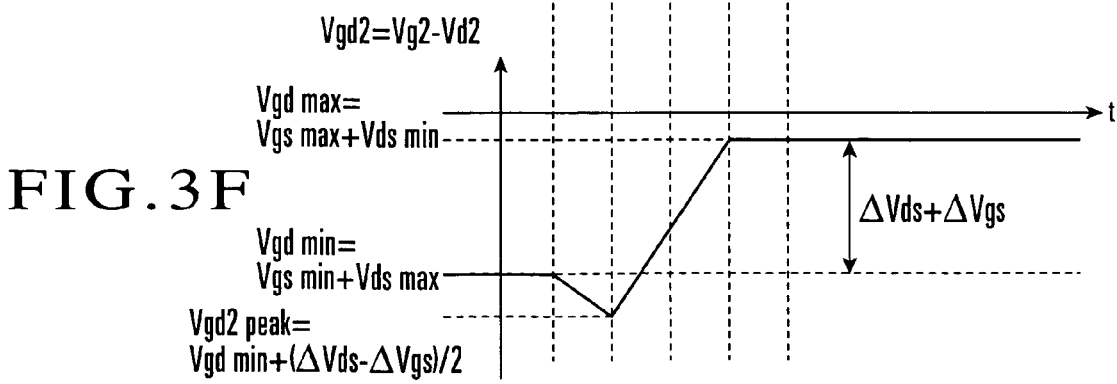

Consequently, the deviation from the voltage division balance in drain-source voltage between the transistors T1 and T2 in changing from OFF to ON is almost half. As shown in FIGS. 3E and 3F, undershoots hardly occur in the drain-source voltage Vds2 and gate-drain voltage Vgd2 of the transistor T2, and the voltage hardly exceeds the breakdown voltage.

Figure 4:
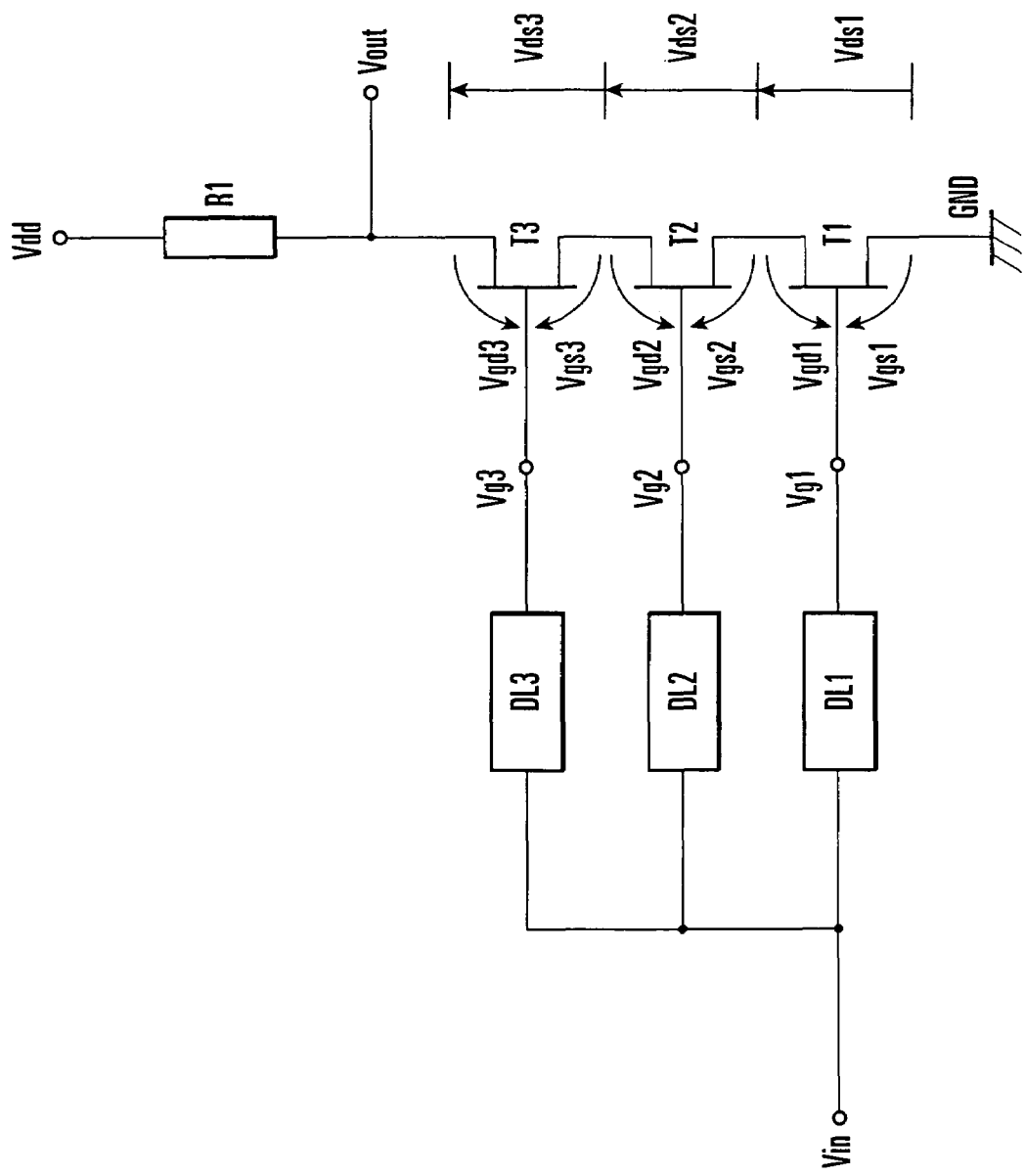
FIG. 4 is a circuit diagram showing the main part of a driver circuit in which three transistors are series-connected.

In the above description, two FETs are series-connected (n=2 for the number n of stages). This arrangement can be extended to series connection of a plurality of FETs. FIG. 4 shows series connection of three FETs (n=3). In FIG. 4, a gate voltage Vgs3 of a transistor T3 to the source has the same voltage relationship as that between the transistors shown in FIG. 1. A voltage which is obtained as a final output voltage from the node between the drain of the transistor T3 and the load resistor R1 is given as a sum of the source-drain voltages of the transistors T1, T2, and T3:

ΔVout=ΔVds1+ΔVds2+ΔVds3

Figure 5:
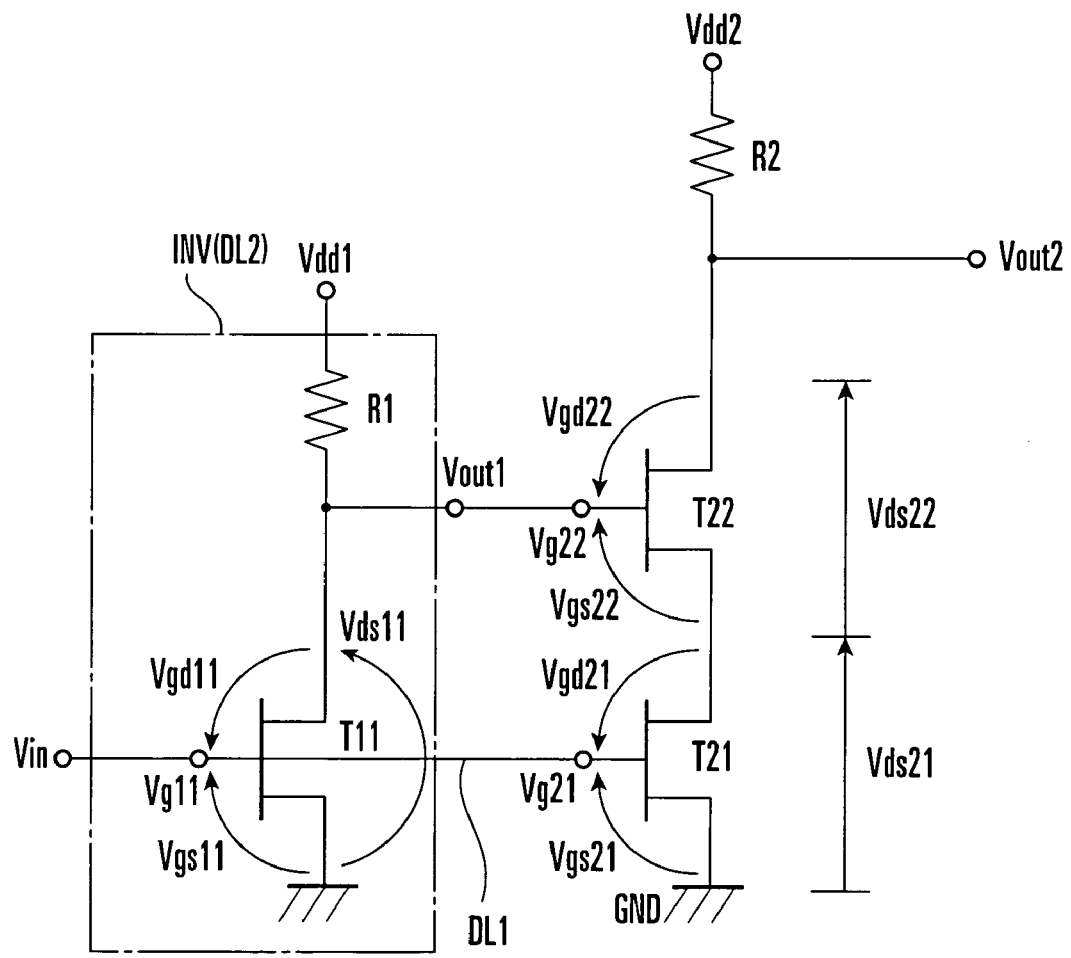
FIG. 5 is a circuit diagram showing a concrete arrangement example of a delay means in the driver circuit of FIG. 1.

FIG. 5 shows a modification to the driver circuit in FIG. 1. In this example, the input signal voltage Vin is directly applied to the gate electrode of a transistor T21 without the mediacy of the delay means DL1. In this case, the delay amount of the delay means DL1 is zero though the structure of the delay means DL1 is not illustrated. In this example, an inverter INV is used as the delay means DL2.

FIG. 5 shows an arrangement example of the driver circuit as the detailed arrangement of the delay means. FIG. 5 shows a driver circuit having an output stage on which two FETs are used as series-connected transistors.

Reference symbols T11, T21, and T22 denote FETs; R1 and R2, load resistors; GND, ground; Vdd1 and Vdd2, positive power supply voltages; Vg11, Vg21, and Vg22, gate voltages of T11, T21, and T22 to ground; and Vout1 and Vout2, output signal voltages of the driving stage and subsequent output stage.

In this circuit, reference symbols V1s1 and V1s2 denote output logic amplitudes at Vout1 and Vout2; Vds11max, Vds21max, and Vds22max, maximum design values of Vds which correspond to the OFF states of T11, T21, and T22; Vds11min, Vds21min, and Vds22min, minimum design values of Vds that correspond to the ON states of T11, T21, and T22; Vgs11max, Vgs21max, and Vgs22max, maximum design values of Vgs that correspond to the ON states of T11, T21, and T22; and Vgs11in, Vgs21min, and Vgs22min, minimum design values of Vgs that correspond to the OFF states of T11, T21, and T22.

Reference numerals Vg11on and Vg21on denote upper limits and Vg22on denotes a lower limit of the gate voltages to ground necessary to simultaneously turn on T11, T21, and T22; Vg11off and Vg21off, lower limits and Vg22off, an upper limit of the gate voltages to ground necessary to simultaneously turn off T11, T21, and T22; Vout1on and Vout2on, Vout1 and Vout2 values corresponding to the simultaneous ON states of T11, T21, and T22; and Vout1off and Vout2off, Vout1 and Vout2 values corresponding to the simultaneous OFF states of T11, T21, and T22.

In this case, Vg11on>Vg11off, Vg21on>Vg21off, and Vg22on<Vg22off are established. Vg22on<Vg22off holds because the source of T22 is connected to the drain of T21, and when T22 is turned on at the same time as T21, the source potential of T22 greatly changes to the negative side.

Letting Vdsbd be the positive breakdown voltage of the drain of the FET to the source, Vgdbd be the negative breakdown voltage of the gate to the drain, and Vgd11min, Vgd21min, and Vgd22min be the minimum voltage values (negative values) of the gates of T11, T21, and T22 to the drains, $$Vds11max < Vdsbd \tag{1-1}$$

$$Vds21max < Vdsbd \tag{1-2}$$

$$Vds22max < Vdsbd \tag{1-3}$$

$$Vgd11min = Vgs11min - Vds11max > Vgdbd \tag{1-4}$$

$$Vgd21min = Vgs21min - Vds21max > Vgdbd \tag{1-5}$$

$$Vgd22min = Vgs22min - Vds22max > Vgdbd \tag{1-6}$$

must be established.

In this circuit, T11, T21, and T22 are simultaneously turned on or off. By applying Kirchhoff's law to cases in which T21 and T22 are simultaneously turned on and off, the following equations are established:

$$Vdd2 - V1s2 - Vds22min - Vds21min = 0 \tag{1-7}$$

$$Vdd2 - Vds22max - Vds21max = 0 \tag{1-8}$$

By solving equations (1-7) and (1-8), the following equations are established:

$$Vdd2 = Vds21max + Vds22max \tag{1-9}$$

$$V1s2 = (Vds21max - Vds21min) + (Vds22max - Vds22min) \tag{1-10}$$

Also, the following equations are established:

$$Vg21on = Vgs21max \tag{1-11}$$

$$Vg21off = Vgs21min \tag{1-12}$$

$$Vg22on = Vds21min + Vgs22max \tag{1-13}$$

$$Vg22off = Vds21max + Vgs22min \tag{1-14}$$

$$Vout2on = Vdd2 - V1s2 \tag{1-15}$$

$$Vout2off = Vdd2 \tag{1-16}$$

From equations (1-9) to (1-16), if Vds21max, Vds21min, Vds22max, Vds22min, Vgs21max, Vgs21min, Vgs22max, and Vgs22min are given, Vdd2, V1s2, Vg21on, Vg21off, Vg22on, Vg22off, Vout2on, and Vout2off are obtained. At this time, from equation (1-10), the output logic amplitude V1s2 on the output stage of the driver circuit having the above arrangement is a sum of amplitudes Vds21max-Vds21min and Vds22max-Vds22min which can be singly output by T21 and T22, and is larger than the amplitude of each transistor.

By applying Kirchhoff's law to cases in which T11 is turned on and off on the driving stage, the following equations are established:

$$Vdd1 - V1s1 - Vds11\text{min} = 0 \quad (1\text{-}17)$$

$$Vdd1 - Vds11\text{max} = 0 \quad (1\text{-}18)$$

By solving equations (1-17) and (1-18), the following equations are established:

$$Vdd1 = Vds11\text{max} \quad (1\text{-}19)$$

$$V1s1 = Vds11\text{max} - Vds11\text{min} \quad (1\text{-}20)$$

Also, the following equations are established:

$$Vg11\text{on} = Vgs11\text{max} \quad (1\text{-}21)$$

$$Vg11\text{off} = Vgs11\text{min} \quad (1\text{-}22)$$

$$Vout1\text{on} = Vdd1 - V1s1 \quad (1\text{-}23)$$

$$Vout1\text{off} = Vdd1 \quad (1\text{-}24)$$

From equations (1-19) to (1-24), when Vds11max, Vds11min, Vgs11max, and Vgs11min are given, Vdd1, V1s1, Vg11on, Vg11off, Vout1on, and Vout1off are obtained.

Connection conditions for the driving and output stages will be considered. In order to design one system for an input signal, the input voltage of T11 on the driving stage and that of T21 on the output stage must be common. This condition is given by $$Vg11\text{on} = Vg21\text{on} \quad (1\text{-}25)$$

$$Vg11\text{off} = Vg21\text{off} \quad (1\text{-}26)$$

Conditions for satisfactorily turning on or off T22 on the output stage by the driving stage are given by $$Vout1\text{on} = Vg22\text{on} \quad (1\text{-}27)$$

$$Vout1\text{off} \leq Vg22\text{off} \quad (1\text{-}28)$$

Concrete design examples are as follows.
Vds11max=2.1 V, Vds11min=0.2 V
Vds21max=2.6 V, Vds21min=0.2 V
Vds22max=2.6 V, Vds22min=0.2 V
Vgs11max=0 V, Vgs11min=−0.5 V
Vgs21max=0 V, Vgs21min=−0.5 V
Vgs22max=0 V, Vgs22min=−0.5 V
In this case,
Vdd1=2.1 V, Vdd2=5.2 V
V1s1=1.9 V, V1s2=4.8 V
Vg11on=0 V, Vg11off=−0.5 V
Vg21on=0 V, Vg21off=−0.5 V
Vg22on=0.2 V, Vg22off=2.1 V
Vout1on=0.2 V, Vout1off=2.1 V
Vout2on=0.4 V, Vout2off=5.2 V As a result, $$V1s2 = 4.8 \text{ V} > Vds21\text{max} - Vds21\text{min}$$
$$= Vds22\text{max} - Vds22\text{min}$$
$$= 2.4 \text{ V}$$

A design for actually outputting an amplitude more than Vdsmax-Vdsmin in one FET can be realized.

Figure 6:
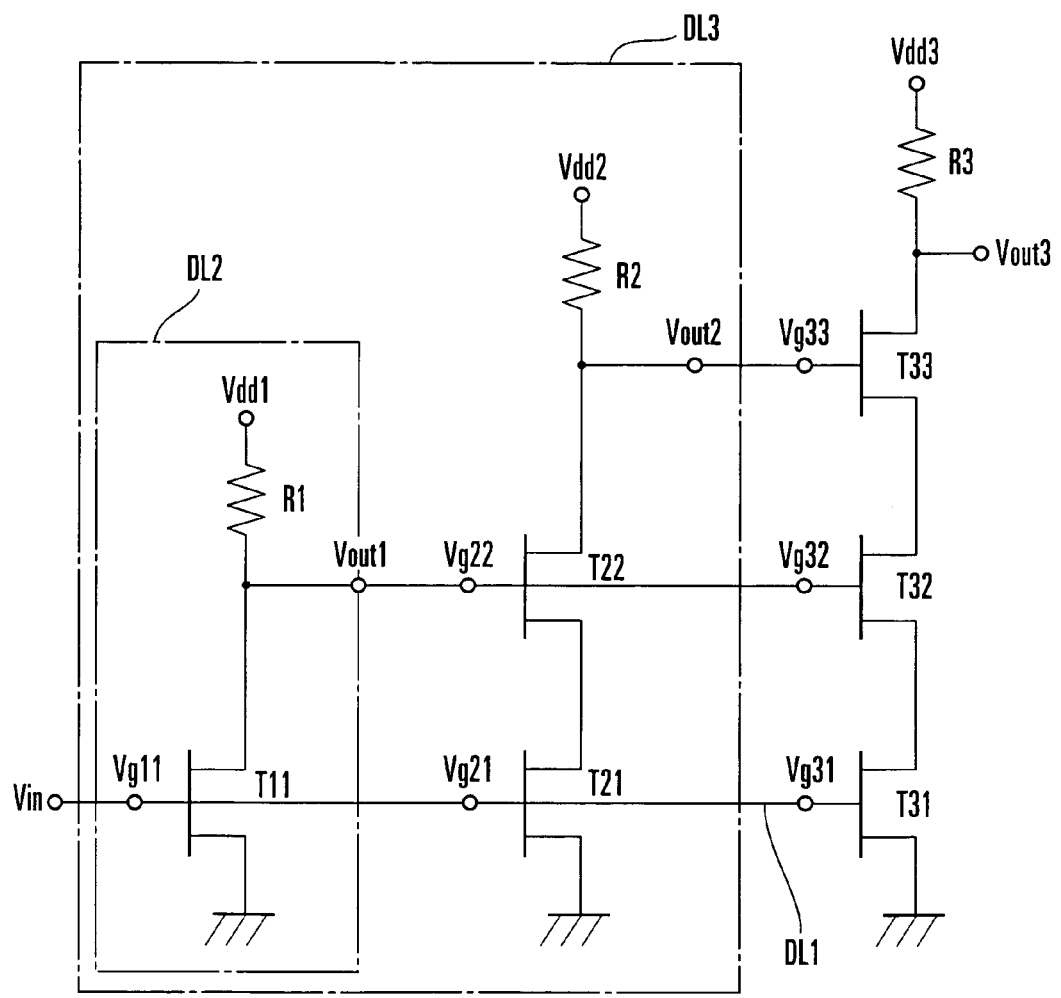
FIG. 6 is a circuit diagram showing a concrete arrangement example of a delay means in the driver circuit of FIG. 4.

FIG. 6 shows extension of the above-described arrangement to n=3. Since the output stage is formed by series-connecting three FETs, the driving stage has a double structure of first and second driving stages in order to attain the above relationship between the source-gate voltages of the FETs. For series connection of n FETs, the driving stage is constituted by n−1 stages. In this case, respective portions shown in FIG. 6 have the following voltage relationship represented by numeral symbols in FIG. 5 and extension suffixes for an increased number of stages:

Vds11max<Vdsbd
Vds21max<Vdsbd
Vds22max<Vdsbd
Vds31max<Vdsbd
Vds32max<Vdsbd
Vds33max<Vdsbd
Vgd11min=Vgs11min−Vds11max>Vgdbd
Vgd21min=Vgs21min−Vds21max>Vgdbd
Vgd22min=Vgs22min−Vds22max>Vgdbd
Vgd31min=Vgs31min−Vds31max>Vgdbd
Vgd32min=Vgs32min−Vds32max>Vgdbd
Vgd33min=Vgs33min−Vds33max>Vgdbd In this circuit, T11, T21, T22, T31, T32, and T33 are simultaneously turned on or off.

By applying Kirchhoff's law to cases in which T31, T32, and T33 are simultaneously turned on and off on the third driving stage, i.e., output stage, the following equations are established:

$$Vdd3 - Vds31\text{min} - Vds32\text{min} - Vds33\text{min} - V1s3 = 0$$

$$Vdd3 - Vds31\text{max} - Vds32\text{max} - Vds33\text{max} = 0$$

These equations are solved into $$Vdd3 = Vds31\text{max} + Vds32\text{max} + Vds33\text{max}$$

$$V1s3 = (Vds31\text{max} - Vds31\text{min}) + (Vds32\text{max} - Vds32\text{min}) + (Vds33\text{max} - Vds33\text{min})$$

The following equations are also established:

$$Vg31\text{on} = Vgs31\text{max}$$

$$Vg31\text{off} = Vgs31\text{min}$$

$$Vg32\text{on} = Vds31\text{min} + Vgs32\text{max}$$

$$Vg32\text{off} = Vds31\text{max} + Vgs32\text{min}$$

$$Vg33\text{on} = Vds31\text{min} + Vds32\text{min} + Vgs33\text{max}$$

$$Vg33\text{off} = Vds31\text{max} + Vds32\text{max} + Vgs33\text{min}$$

$$Vout3\text{on} = Vdd3 - V1s3$$

$$Vout3\text{off} = Vdd3$$

By applying Kirchhoff's law to cases in which T21 and T22 are simultaneously turned on and off on the second driving stage, the following equations are established:

$$Vdd2-Vds21min-Vds22min-V1s2=0$$

$$Vdd2-Vds21max-Vds22max=0$$

These equations are solved into $$Vdd2=Vds21max+Vds22max$$

$$V1s2=(Vds21max-Vds21min)+(Vds22max-Vds22min)$$

The following equations are also established:

$$Vg21on=Vgs21max$$

$$Vg21off=Vgs21min$$

$$Vg22on=Vds21min+Vgs22max$$

$$Vg22off=Vds21max+Vgs22min$$

$$Vout2on=Vdd2-V1s2$$

$$Vout2off=Vdd2$$

By applying Kirchhoff's law to cases in which T11 is turned on and off on the first driving stage, the following equations are established:

$$Vdd1-Vds11in-V1s1=0$$

$$Vdd1-Vds11max=0$$

These equations are solved into $$Vdd1=Vds11max$$

$$V1s1=Vds11max-Vds11min$$

The following equations are also established:

$$Vg11on=Vgs11max$$

$$Vg11off=Vgs11min$$

$$Vout1on=Vdd1-V1s1$$

$$Vout1off=Vdd1$$

Connection conditions for the first to third driving stages are given by
Vg11on=Vg21on=Vg31on
Vg11off=Vg21off=Vg31off
Vg22on=Vg32on
Vg22off=Vg32off Conditions for satisfactorily turning on or off Tj,i+1 on the jth (j=i+1, ..., 3) driving stage by the ith (i=1, 2) driving stage are given by
Vout1on=Vg22on
Vout1on=Vg32on
Vout2on=Vg33on
Vout1off≦Vg22off
Vout1off≦Vg32off
Vout2off≦Vg33off In this manner, an output equal to or larger than the maximum rated output of a transistor on the output stage can be extracted.

The above embodiment has described up to a three-transistor arrangement for n=3, and this arrangement can be further extended as follows. That is, the output stage is constituted by n (n=3, 4, . . . ) transistors. These transistors are series-connected such that the source electrode of the first (i.e., lowest) transistor on the output stage is connected to the first fixed potential, the drain electrode of the first transistor on the output stage is connected to the source electrode of the second (second lowest) transistor on the output stage, and the drain electrode of the ith (i=2, . . . , n−1) transistor on the output stage is connected to the source electrode of the (i+1)th transistor on the output stage. One terminal of a load resistor on the output stage is connected to the drain electrode of the nth transistor on the output stage, and the other terminal of the load resistor on the output stage is connected to the second potential.

In the output stage circuit having this arrangement, the gate electrode voltages of the transistors are synchronously controlled such that the potential of the gate electrode of the jth (j=1, 2, . . . , n) transistor to the source electrode always becomes constant for the transistors. The value of the gate voltage to the source of the jth transistor synchronously changes. Accordingly, an output voltage extracted from the drain electrode of the nth transistor on the output stage can be obtained as a sum of the voltages between the source and drain electrodes of the transistors.

The first driving stage which drives the output stage is constituted by series-connecting (n−1) transistors. An output from the driver circuit is extracted from the node at the gate electrode of the ith transistor and the node between the drain electrode of the (n−1)th transistor and the first load resistor. The potentials between the source and gate electrodes of the transistors on the output stage are set equal between the transistors. Outputs from the driving stage are supplied to the gate electrodes of the transistors on the output stage. The source electrode of the first, i.e., lowest transistor on the first driving stage is connected to the third fixed potential. The other terminal of the first load resistor is connected to the fourth fixed potential.

A control signal to the transistors which form the first driving stage is extracted from the node at the gate electrode of the kth (k=1, 2, . . . , (n−2)) transistor on the second driving stage constituted by series-connecting (n−2) transistors and from the node between the drain electrode of the (n−2)th transistor and the second load resistor. The extracted control signal is supplied to the gate electrodes of the transistors on the first driving stage, and this operation is repeated. The (n−1)th driving stage is formed from one transistor such that an input signal is supplied to the gate electrode of the transistor, the source electrode is connected to the (2n−1)th fixed potential, and the drain electrode is connected to the 2nth fixed potential. The (2j−1)th fixed potential may be identical, as shown in FIG. 6, or different.

Figure 7:
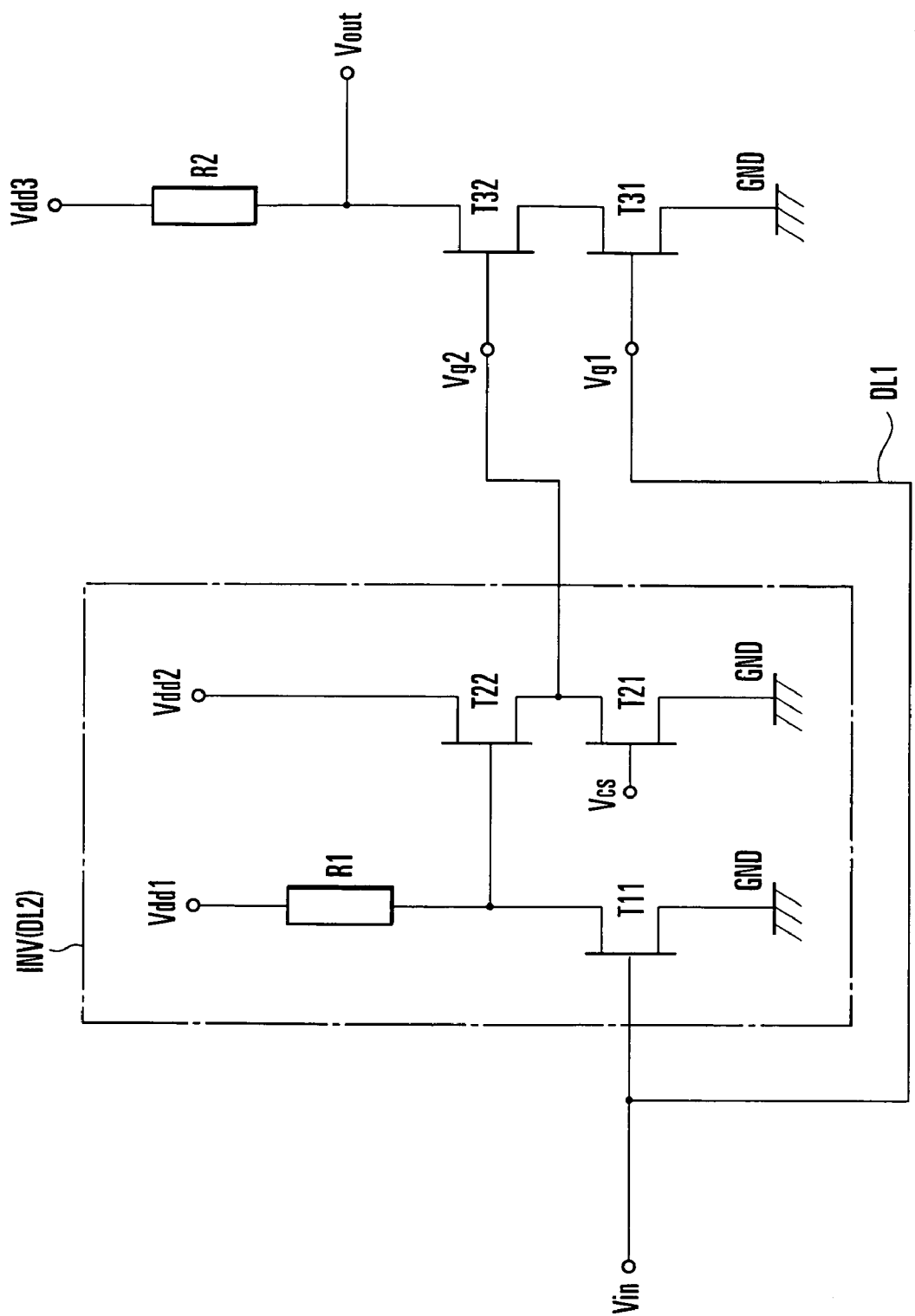
FIG. 7 is a circuit diagram showing a modification to the driver circuit in FIG. 1.

FIG. 7 shows a modification to the driver circuit in FIG. 1. In this example, the input signal voltage Vin is applied to the gate electrode of the transistor T31 without the mediacy of the delay means DL1. In this case, the delay amount of the delay means DL1 is 0 though the delay means DL1 is not illustrated. In this example, an inverter INV is used as the delay means DL2.

As the inverter INV, a series circuit of the resistor R1 and transistor T11 is arranged on the first stage, and a series circuit of the transistors T21 and T22 is arranged on the second stage. The series circuit of the resistor R1 and transistor T11 is connected between the power supply voltage Vdd1 and GND. The series circuit of the transistors T21 and T22 is connected between the power supply voltage Vdd2 and GND. The input signal voltage Vin is applied to the gate electrode of the transistor T11. A potential generated at the node between the resistor R1 and the transistor T11 is applied to the gate electrode of the transistor T22. A fixed potential Vcs is applied to the gate electrode of the transistor T21.

In this example, a source follower circuit is added to the output of the inverter formed from one FET, and the whole circuit also functions as the inverter. The delay of the whole inverter increases, further reducing undershoots in the drain-source voltage Vds and gate-drain voltage Vgd that remain in the example of FIG. 5 described as a concrete example of FIG. 1. As a result, Vds and Vgd can be prevented from exceeding their breakdown voltages.

Figure 8:
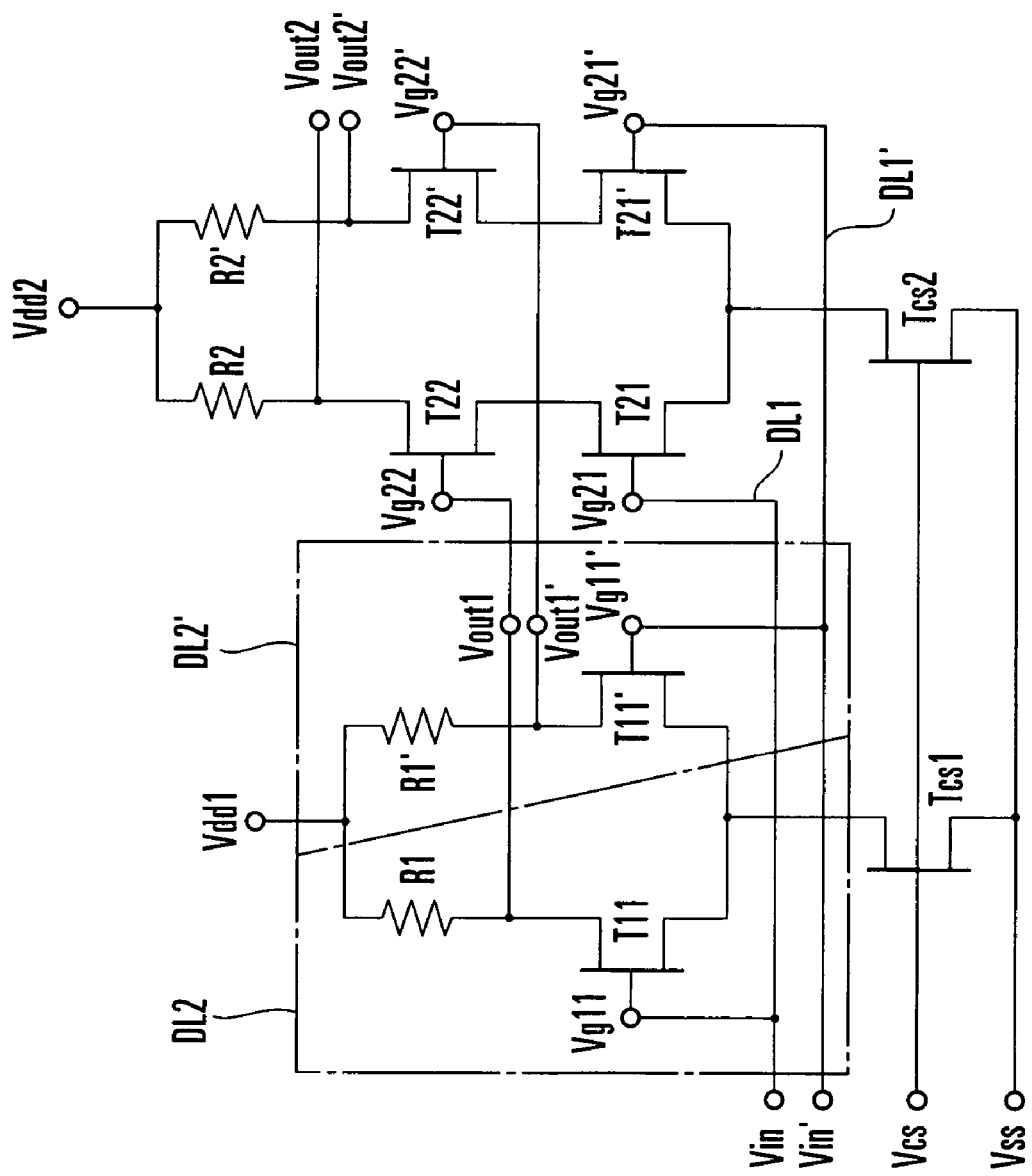
FIG. 8 is a circuit diagram showing the first arrangement example of a current switching driver circuit.

FIG. 8 shows an example of a driver circuit having an output stage constituted by series-connecting two FETs for each circuit of a differential pair on the basis of the current switching circuit arrangement. Reference symbols T11, T11', T21, T21', T22, T22', Tcs1, and Tcs2 denote FETs; R1, R1', R2, and R2', resistors; Vss, Vdd1, and Vdd2, power supply voltages; Vg11, Vg11', Vg21, Vg21', Vg22, and Vg22', gate voltages of T11, T11', T21, T21', T22, and T22' to ground; Vdscs1 and Vdscs2, drain-source voltages of Tcs1 and Tcs2; and Vout1, Vout1', Vout2, and Vout2', output signal voltages of the driving stage and subsequent output stage.

Only one circuit of the differential pair will be described. The other circuit is reversely turned on and off. Reference symbols V1s1 and V1s2 denote output logic amplitudes at Vout1 and Vout2; Vds11max, Vds2max, and Vds22max, maximum design values of Vds which correspond to the OFF states of T11, T21, and T22; Vds11min, Vds2min, and Vds22min, minimum design values of Vds that correspond to the ON states of T11, T21, and T22; Vgs11max, Vgs21max, and Vgs22max, maximum design values of Vgs that correspond to the ON states of T11, T21, and T22; and Vgs11min, Vgs21min, and Vgs22min, minimum design values of Vgs that correspond to the OFF states of T11, T21, and T22.

Reference numerals Vg11on and Vg21on denote upper limits and Vg22on denotes a lower limit of the gate voltages to ground necessary to simultaneously turn on T11, T21, and T22; Vg11off and Vg21off, lower limits and Vg22off, an upper limit of the gate voltages to ground necessary to simultaneously turn off T11, T21, and T22; Vout1on and Vout2on, Vout1 and Vout2 values corresponding to the simultaneous ON states of T11, T21, and T22; and Vout1off and Vout2off, Vout1 and Vout2 values corresponding to the simultaneous OFF states of T11, T21, and T22.

In this case,

Vg11on>Vg11off
Vg21on>Vg21off
Vg22on<Vg22off are established.

Vg22on<Vg22off holds because the source of T22 is connected to the drain of T21, and when T22 is turned on at the same time as T21, the source potential of T22 greatly changes to the negative side.

Letting Vdsbd be the positive breakdown voltage of the drain of the FET to the source, Vgdbd be the negative breakdown voltage of the gate to the drain, and Vgd11min, Vgd21min, and Vgd22min be the minimum voltage values (negative values) of the gates of T11, T21, and T22 to the drains, $$Vds11max<Vdsbd \quad (2\text{-}1)$$

$$Vds21max<Vdsbd \quad (2\text{-}2)$$

$$Vds22max<Vdsbd \quad (2\text{-}3)$$

$$Vgd11min=Vgs11min-Vds11max>Vgdbd \quad (2\text{-}4)$$

$$Vgd21min=Vgs21min-Vds21max>Vgdbd \quad (2\text{-}5)$$

$$Vgd22min=Vgs22min-Vds22max>Vgdbd \quad (2\text{-}6)$$

must be established.

In the current switching circuit, Vds11min, Vds21min, and Vds22min are set to

Vds11min>Vgs11max−Vgs11min
Vds21min>Vgs21max−Vgs21min
Vds22min>Vgs22max−Vgs22min With these settings, T11, T21, and T22 can always be operated within the saturation region of the FET drain voltage-drain current characteristic. Higher-speed operation can be realized in comparison with a single-end arrangement such as the driver circuit shown in FIG. 5 in which T11, T21, and T22 operate even within the linear region of the FET drain voltage-drain current characteristic for Vds11min<Vgs11max−Vgs11min, Vds21min<Vgs21max−Vgs21min, and Vds22min<Vgs22max−Vgs22min.

In this circuit, T11, T21, and T22 are simultaneously turned on or off. By applying Kirchhoff's law to cases in which T21 and T22 are simultaneously turned on and off, the following equations are established:

$$Vdd2-V1s2-Vds22min-Vds21min-Vdscs2=Vss \quad (2\text{-}7)$$

$$Vdd2-Vds22max-Vds21max-Vdscs2=Vss \quad (2\text{-}8)$$

By solving equations (2-7) and (2-8), the following equations are established:

$$Vdd2=Vds22max+Vds21max+Vdscs2+Vss \quad (2\text{-}9)$$

$$V1s2=(Vds22max-Vds22min)+(Vds21max-Vds21min) \quad (2\text{-}10)$$

Also, the following equations are established:

$$Vg21on=Vgs21max+Vdscs2+Vss \quad (2\text{-}11)$$

$$Vg21off=Vgs21min+Vdscs2+Vss \quad (2\text{-}12)$$

$$Vg22on=Vds21min+Vgs22max+Vdscs2+Vss \quad (2\text{-}13)$$

$$Vg22off=Vds21max+Vgs22min+Vdscs2+Vss \quad (2\text{-}14)$$

$$Vout2on=Vdd2-V1s2 \quad (2\text{-}15)$$

$$Vout2off=Vdd2 \quad (2\text{-}16)$$

From equations (2-9) to (2-16), if Vds21max, Vds21min, Vds22max, Vds22min, Vgs21max, Vgs21min, Vgs22max, Vgs22min, Vss, and Vdscs2 are given, Vdd2, V1s2, Vg21on, Vg21off, Vg22on, Vg22off, Vout2on, and Vout2off are obtained. At this time, from equation (2-10), the output logic amplitude V1s2 on the output stage of the driver circuit having the above arrangement is a sum of amplitudes Vds21max−Vds21min and Vds22max−Vds22min which can be singly output by T21 and T22, and is larger than the output amplitude of each transistor.

By applying Kirchhoff's law to cases in which T11 is turned on and off on the driving stage, the following equations are established:

$$Vdd1-V1s1-Vds11min-Vdscs1=Vss \quad (2\text{-}17)$$

$$Vdd1-Vds11max-Vdscs1=Vss \quad (2\text{-}18)$$

By solving equations (2-17) and (2-18), the following equations are established:

$$Vdd1=Vds11\text{max}+Vdscs1+Vss \quad (2\text{-}19)$$

$$V1s1=Vds11\text{max}-Vds11\text{min} \quad (2\text{-}20)$$

Also, the following equations are established:

$$Vg11\text{on}=Vgs11\text{max}+Vdscs1+Vss \quad (2\text{-}21)$$

$$Vg11\text{off}=Vgs11\text{min}+Vdscs1+Vss \quad (2\text{-}22)$$

$$Vout1\text{on}=Vdd1-V1s1 \quad (2\text{-}23)$$

$$Vout1\text{off}=Vdd1 \quad (2\text{-}24)$$

From equations (2-19) to (2-24), when Vds11max, Vds11min, Vgs11max, Vgs11min, Vss, and Vdscs1 are given, Vdd1, V1s1, Vg11on, Vg11off, Vout1on, and Vout1off are obtained.

Connection conditions for the driving and output stages will be considered. In order to design one system for an input signal, the input voltage of T11 on the driving stage and that of T21 on the output stage must be common. This condition is given by $$Vg11\text{on}=Vg21\text{on} \quad (2\text{-}25)$$

$$Vg11\text{off}=Vg21\text{off} \quad (2\text{-}26)$$

Conditions for satisfactorily turning on or off T22 on the output stage by the driving stage are given by $$Vout1\text{on}=Vg22\text{on} \quad (2\text{-}27)$$

$$Vout1\text{off} \leq Vg22\text{off} \quad (2\text{-}28)$$

Concrete design examples are as follows.
Vss=−6.6 V
Vdscs1=1.4 V, Vdscs2=1.4 V
Vds11max=2.1 V, Vds11min=0.85 V
Vds21max=2.6 V, Vds21min=0.85 V
Vds22max=2.6 V, Vds22min=0.85 V
Vgs11max=0 V, Vgs11min=−0.5 V
Vgs21max=0 V, Vgs21min=−0.5 V
Vgs22max=0 V, Vgs22min=−0.5 V
In this case,
Vdd1=−3.1 V, Vdd2=0 V
V1s1=1.25 V, V1s2=3.5 V
Vg11on=−5.2 V, Vg11off=−5.7 V
Vg21on=−5.2 V, Vg21off=−5.7 V
Vg22on=−4.35 V, Vg22off=−3.1 V
Vout1on=−4.35 V, Vout1off=−3.1 V
Vout2on=−3.5 V, Vout2off=0 V
As a result, $$V1s2 = 3.5\ V > Vds21\text{max} - Vds21\text{min}$$
$$= Vds22\text{max} - Vds22\text{min}$$
$$= 1.75\ V$$

A design for actually outputting an amplitude more than Vdsmax−Vdsmin in one FET can be realized.

Figure 9:
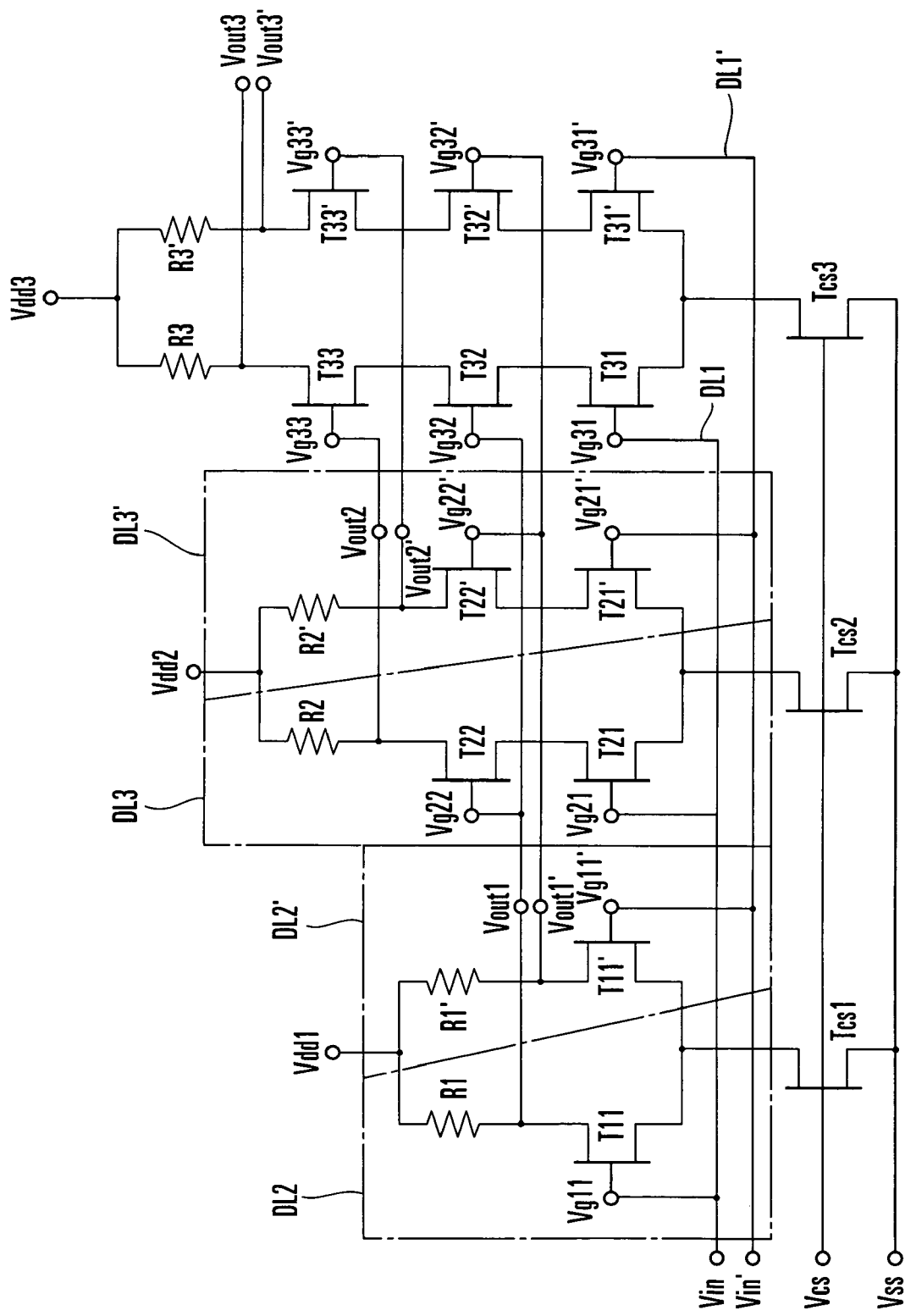
FIG. 9 is a circuit diagram showing the second arrangement example of the current switching driver circuit.

FIG. 9 shows a circuit arrangement when the above-described current switching circuit for n=2 is extended to n=3. Also in this case, similar to FIGS. 5 and 6, as the number of series-connected transistor in differential pairs on the output stage increases, the number of series-connected transistors on the driving stage directly before increases, and the driving voltage relationship on the output stage is set. The circuit arrangement of FIG. 9 will be explained as extension of the above description. The voltage relationship between respective portions in FIG. 9 can be summarized into Vds11max<Vdsbd
Vds21max<Vdsbd
Vds22max<Vdsbd
Vdd31max<Vdsbd
Vds32max<Vdsbd
Vds33max<Vdsbd
Vgd11min=Vgs11min−Vds11max>Vgdbd
Vgd21min=Vgs21min−Vds21max>Vgdbd
Vgd22min=Vgs22min−Vds22max>Vgdbd
Vgd31min=Vgs31min−Vdd31max>Vgdbd
Vgd32min=Vgs32min−Vds32max>Vgdbd
Vgd33min=Vgs33min−Vds33max>Vgdbd In this circuit, T11, T21, T22, T31, T32, and T33 are simultaneously turned on or off. By applying Kirchhoff's law to cases in which T31, T32, and T33 are simultaneously turned on and off on the third driving stage, i.e., output stage, the following equations are established:

$$Vdd3-Vds31\text{min}-Vds32\text{min}-Vds33\text{min}-V1s3-Vdscs3=Vss$$

$$Vdd3-Vds31\text{max}-Vds32\text{max}-Vds33\text{max}-Vdscs3=Vss$$

These equations are solved into $$Vdd3=Vds31\text{max}+Vds32\text{max}+Vds33\text{max}+Vdscs3+Vss$$

$$V1s3=(Vds31\text{max}-Vds31\text{min})+(Vds32\text{max}-Vds32\text{min})+(Vds33\text{max}-Vds33\text{min})$$

The following equations are also established:

$$Vg31\text{on}=Vgs31\text{max}$$

$$Vg31\text{off}=Vgs31\text{min}$$

$$Vg32\text{on}=Vds31\text{min}+Vgs32\text{max}$$

$$Vg32\text{off}=Vds31\text{max}+Vgs32\text{min}$$

$$Vg33\text{on}=Vds31\text{min}+Vds32\text{min}+Vgs33\text{max}$$

$$Vg33\text{off}=Vds31\text{max}+Vds32\text{max}+Vgs33\text{min}$$

$$Vout3\text{on}=Vdd3-V1s3$$

$$Vout3\text{off}=Vdd3$$

By applying Kirchhoff's law to cases in which T21 and T22 are simultaneously turned on and off on the second driving stage, the following equations are established:

$$Vdd2-Vds21\text{min}-Vds22\text{min}-V1s2-Vdscs2=Vss$$

$$Vdd2-Vds2\text{max}-Vds22\text{max}-Vdscs2=Vss$$

These equations are solved into $$Vdd2=Vds21\text{max}+Vds22\text{max}+Vdscs2+Vss$$

$$V1s2=(Vds21\text{max}-Vds21\text{min})+(Vds22\text{max}-Vds22\text{min})$$

The following equations are also established:

$$Vg21\text{on}=Vgs21\text{max}+Vdscs2+Vss$$

$$Vg21\text{off}=Vgs21\text{min}+Vdscs2+Vss$$

$Vg22\text{on} = Vds21\text{min} + Vgs22\text{max} + Vdscs2 + Vss$ $Vg22\text{off} = Vds21\text{max} + Vgs22\text{min} + Vdscs2 + Vss$ $Vout2\text{on} = Vdd2 - V1s2$ $Vout2\text{off} = Vdd2$ By applying Kirchhoff's law to cases in which T11 is turned on and off on the first driving stage, the following equations are established:

$Vdd1 - Vds11\text{min} - V1s1 - Vdscs1 = Vss$ $Vdd1 - Vds11\text{max} - Vdscs1 = Vss$ These equations are solved into $Vdd1 = Vds11\text{max} + Vdscs1 + Vss$ $V1s1 = Vds11\text{max} - Vds11\text{min}$ The following equations are also established:

$Vg11\text{on} = Vgs11\text{max} + Vdscs1 + Vss$ $Vg11\text{off} = Vgs11\text{min} + Vdscs1 + Vss$ $Vout1\text{on} = Vdd1 - V1s1$ $Vout1\text{off} = Vdd1$ Connection conditions for the first to third driving stages are given by Vg11on=Vg21on=Vg31on
Vg11off=Vg21off=Vg31off
Vg22on=Vg32on
Vg22off=Vg32off Conditions for satisfactorily turning on or off Tj,i+1 on the jth (j=i+1, ..., 3) driving stage by the ith (i=1, 2) driving stage are given by Vout1on=Vg22on
Vout1on=Vg32on
Vout2on=Vg33on
Vout1off≦Vg22off
Vout1off≦Vg32off
Vout2off≦Vg33off As described above, the gates of FETs on respective stages are so synchronously driven as to satisfy these relations. The purpose of the present invention can therefore be achieved.

Circuits shown in FIGS. 10, 11, 12, 13, and 14 are constituted by applying level shift diodes to the circuits in FIGS. 1, 4, 5, 8, and 9.

The circuit of FIG. 12 will be explained. A diode D21 is inserted between the drain of T21 and the source of T22 with a cathode facing the drain of T21 and an anode facing the source of T22.

In general, almost the same potential difference is given between diode connections by utilizing the fact that the forward voltage value is almost constant in the forward current-voltage characteristic of a diode regardless of the current amount. The purpose of applying a diode is to, when any one of T11, T21, and T22 does not satisfy the conditions of equations (1-1) to (1-6) or equations (1-27) and (1-28) owing to bias setting conditions, generate a level shift at each node by applying the diode and satisfy the same conditions.

Figure 12:
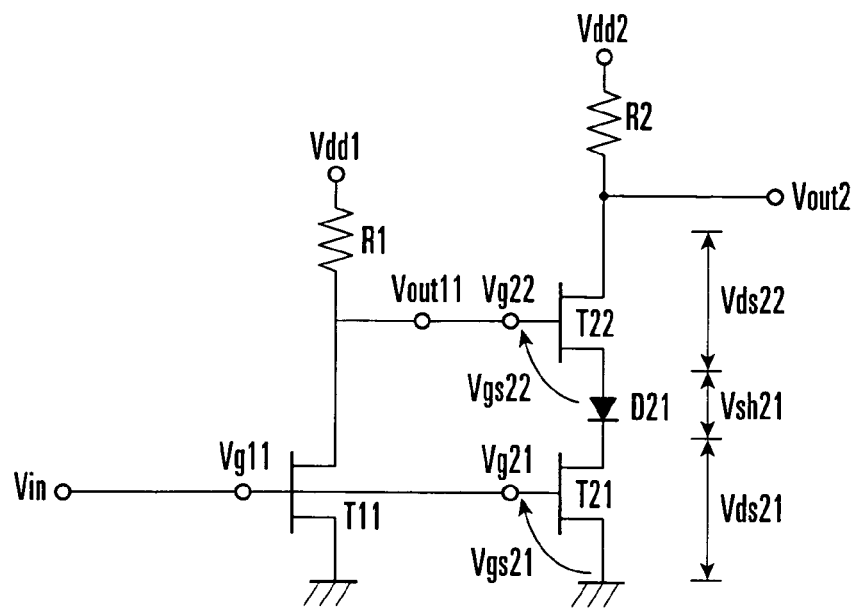
FIG. 12 is a circuit diagram showing the second arrangement example in which the level shift diode is applied.

Letting Vsh21 be the voltage level shift amount of D21 in FIG. 12, $Vds11\text{max} < Vdsbd$ (4-1)

$Vds21\text{max} < Vdsbd$ (4-2)

$Vds22\text{max} < Vdsbd$ (4-3)

$Vgd11\text{min} = Vgs11\text{min} - Vds11\text{max} > Vgdbd$ (4-4)

$Vgd21\text{min} = Vgs21\text{min} - Vds21\text{max} > Vgdbd$ (4-5)

$Vgd22\text{min} = Vgs22\text{min} - Vds22\text{max} > Vgdbd$ (4-6)

Under these conditions, equations (1-7) and (1-8) of Kirchhoff's law on the output stage are rewritten into $Vdd2 - V1s2 - Vds22\text{min} - Vsh21 - Vds21\text{min} = 0$ (4-7)

$Vdd2 - Vds22\text{max} - Vsh21 - Vds21\text{max} = 0$ (4-8)

Equations (4-7) and (4-8) are solved into $Vdd2 = Vds21\text{max} + Vds22\text{max} + Vsh21$ (4-9)

$V1s2 = (Vds21\text{max} - Vds21\text{min}) + (Vds22\text{max} - Vds22\text{min})$ (4-10)

Equations (1-11) to (1-16) are rewritten into $Vg21\text{on} = Vgs21\text{max}$ (4-11)

$Vg21\text{off} = Vgs21\text{min}$ (4-12)

$Vg22\text{on} = Vds21\text{min} + Vsh21 + Vgs22\text{max}$ (4-13)

$Vg22\text{off} = Vds21\text{max} + Vsh21 + Vgs22\text{min}$ (4-14)

$Vout2\text{on} = Vdd2 - V1s2$ (4-15)

$Vout2\text{off} = Vdd2$ (4-16)

Equations (1-17) to (1-24) for the driving stage and conditions (1-25) to (1-28) are the same. From equation (4-10), the output logic amplitude V1s2 on the output stage is a sum of amplitudes Vds21max−Vds21min and Vds22max−Vds22min.

Figure 10:
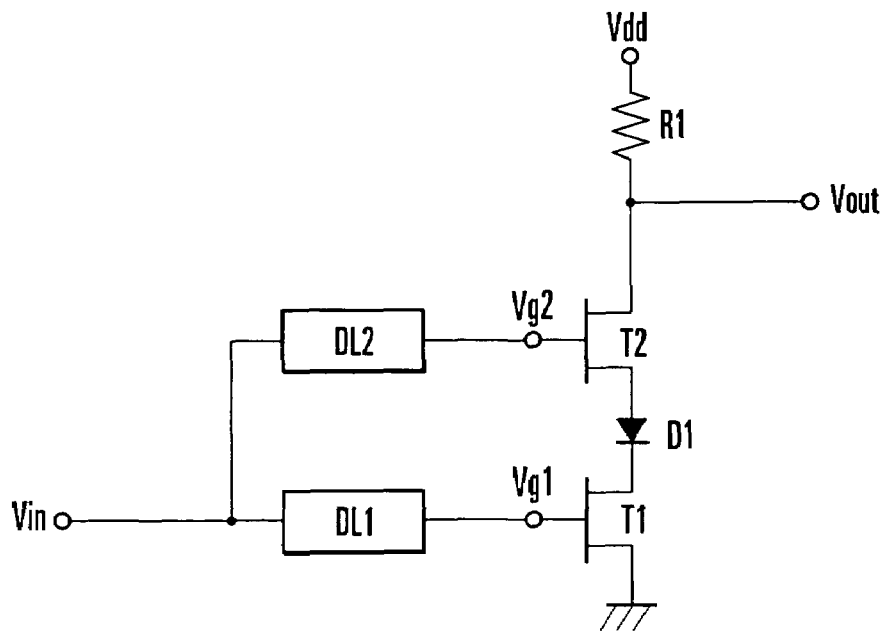
FIG. 10 is a circuit diagram showing the first arrangement example in which a level shift diode is applied.

If Vgs11max=Vgs21max=Vgs22max=−0.5 V and Vgs11min=Vgs21min=Vgs22min=−1 V in the concrete design example of FIG. 5, Vg22on=−0.3 V in the absence of any level shift diode, and the condition of equation (1-27) is not satisfied. In the circuit arrangement using D21, for example, for Vsh21=0.7 V, a design which satisfies the condition is obtained by Vds11max=2.3 V, Vds11min=0.4 V
Vds21max=2.6 V, Vds21min=0.2 V
Vds22max=2.6 V, Vds22min=0.2 V
Vdd1=1.6 V, V1s1=1.9 V
Vg11on=−0.5 V, Vg11off=−1 V
Vdd2=5.2 V, V1s2=4.8 V
Vg21on=−0.5 V, Vg21off=−1 V
Vg22on=0.4 V, Vg22off=2.3 V
Vout1on=0.4 V, Vout1off=2.3 V
Vout2on=1.1 V, Vout2off=5.9 V The circuit of FIG. 10 will be explained. A diode D1 is inserted between the drain of T1 and the source of T2 with a cathode connected to the drain of T1 and an anode connected to the source of T2. Other portions of FIG. 10 are the same as those in the circuit shown in FIG. 1.

Figure 11:
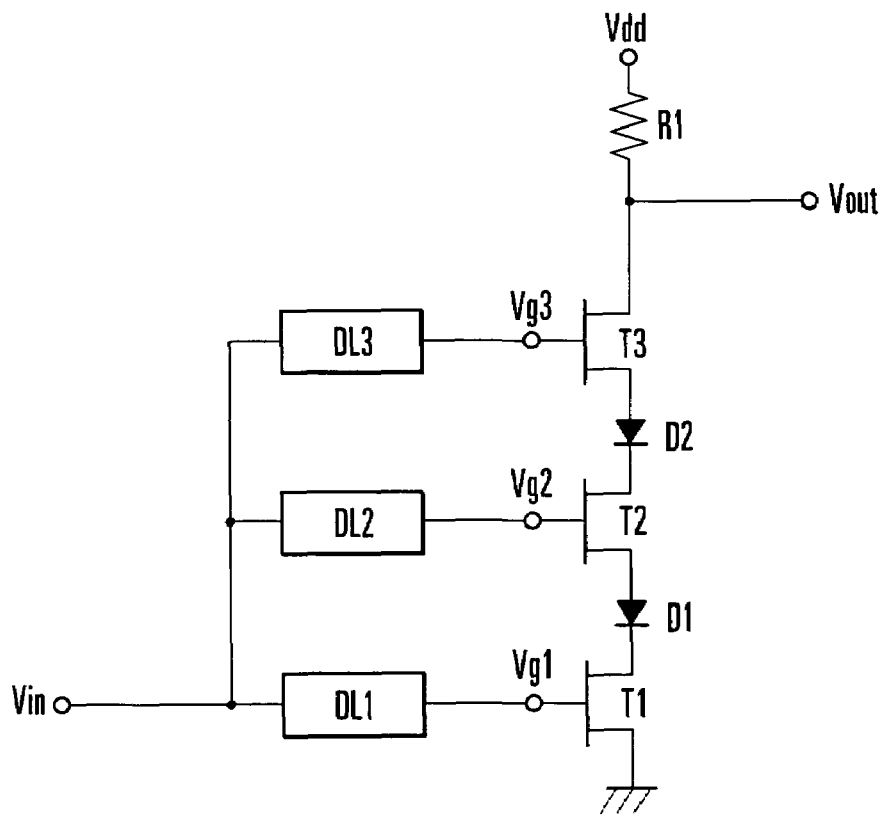
FIG. 11 is a circuit diagram showing an arrangement example in which the diode is applied.

The circuit of FIG. 11 will be explained. A diode D1 is inserted between the drain of T1 and the source of T2 with a cathode connected to the drain of T1 and an anode connected to the source of T2. A diode D2 is inserted between the drain of T2 and the source of T3 with a cathode connected to the drain of T2 and an anode connected to the source of T3. Other portions of FIG. 11 are the same as those in the circuit shown in FIG. 4.

Figure 13:
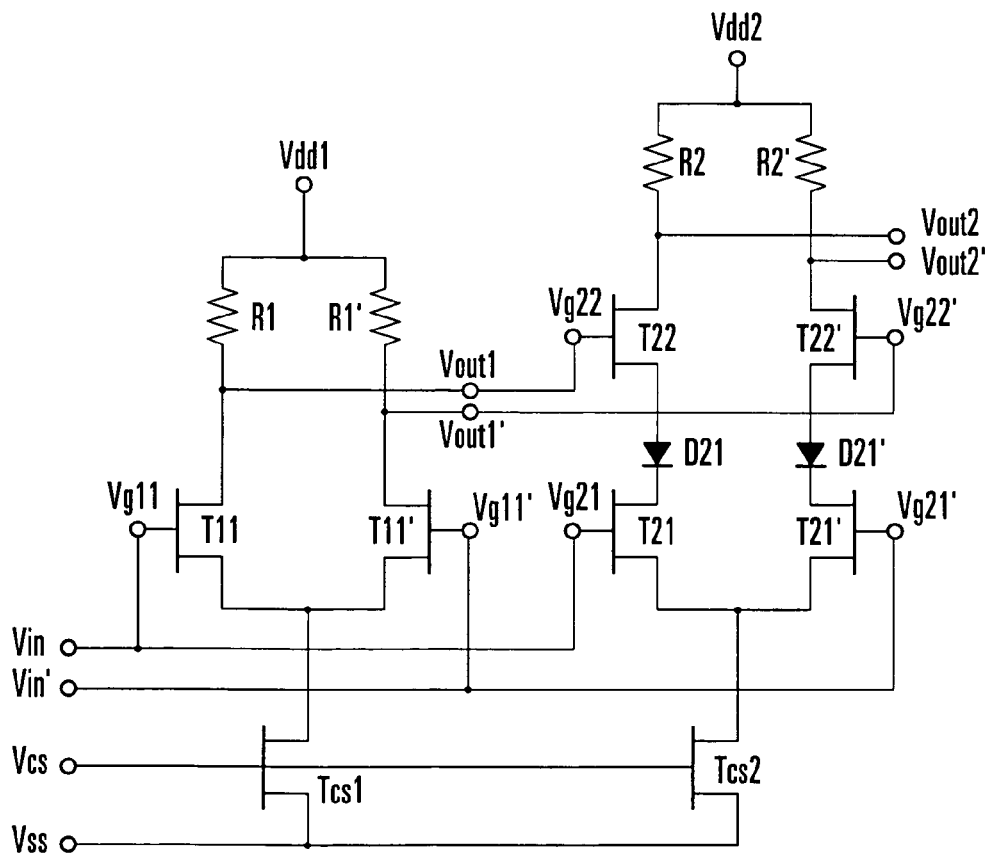
FIG. 13 is a circuit diagram showing the third arrangement example in which the level shift diode is applied.

The circuit of FIG. 13 will be explained. Diodes D21 and D21' are inserted between the drain of T21 and the source of T22 and between the drain of T21' and the source of T22', respectively, with cathodes connected to the drains of T21 and T21' and anodes connected to the sources of T22 and T22'. Other portions of FIG. 13 are the same as those in the circuit shown in FIG. 8.

Figure 14:
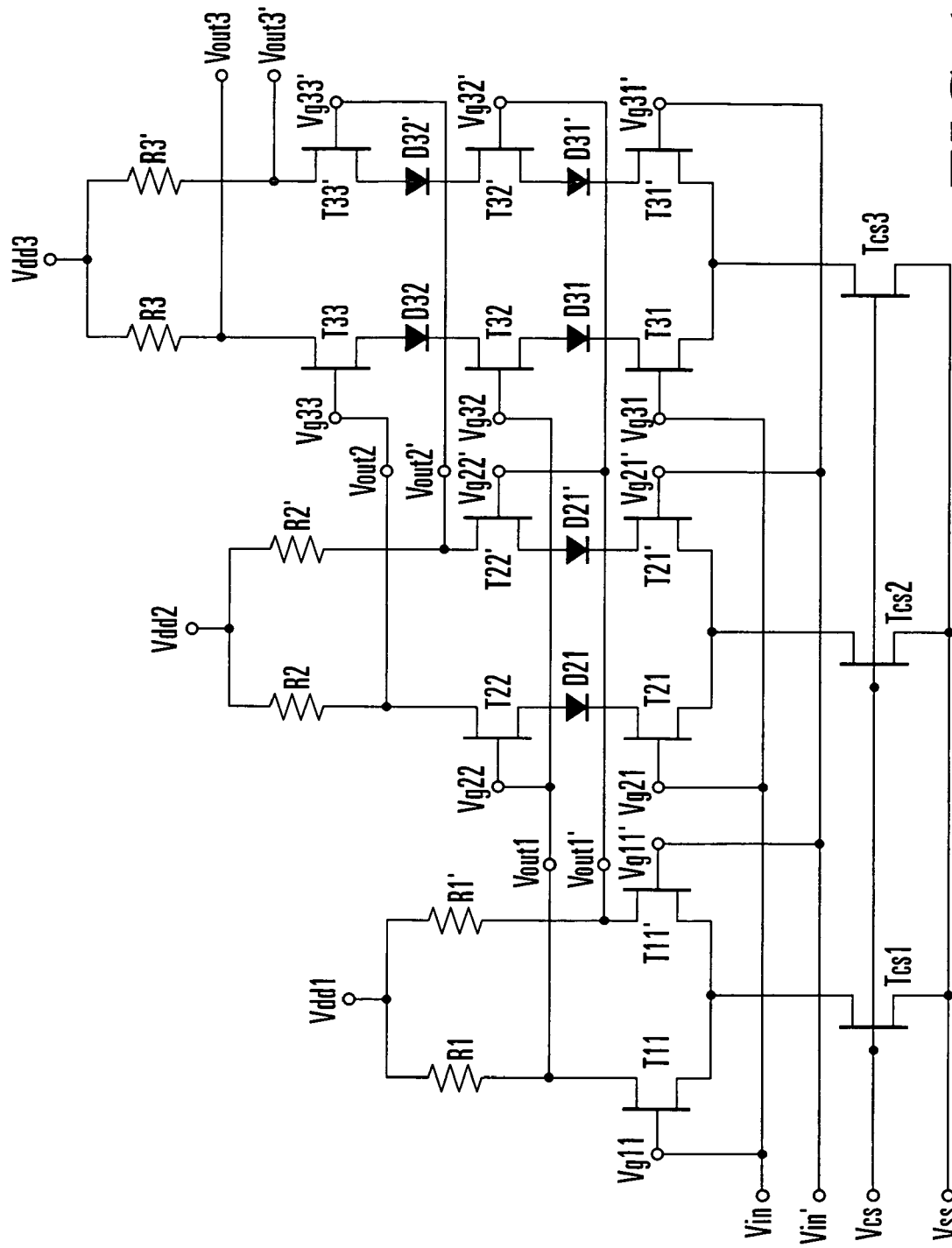
FIG. 14 is a circuit diagram showing another arrangement example in which the diode is applied.
Figure 15:
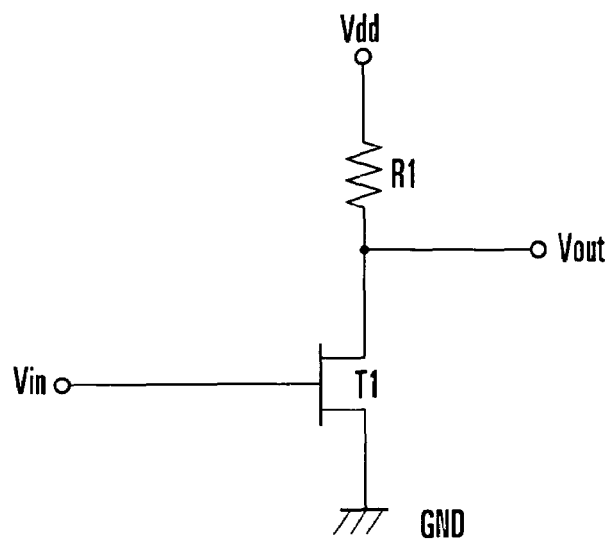
FIG. 15 is a circuit diagram showing the main part of a conventional driver circuit.
Figure 16:
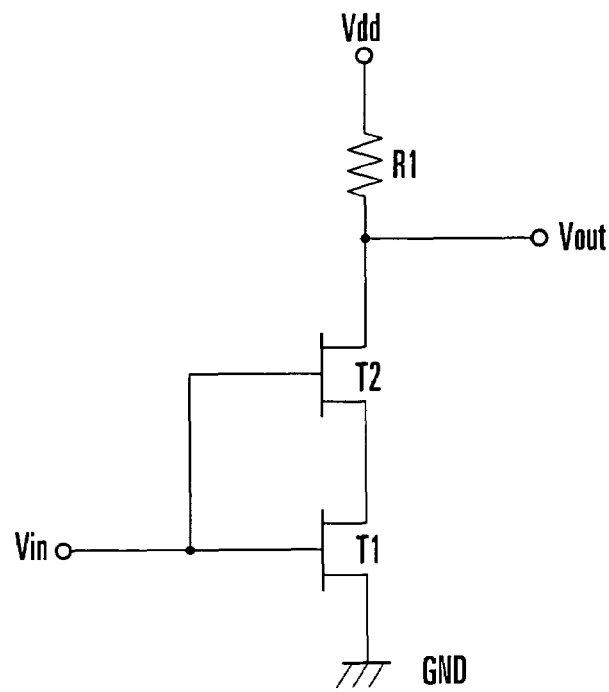
FIG. 16 is a circuit diagram showing the main part of a driver circuit disclosed in Japanese Patent Laid-Open No. 3-73917.
Figure 17A:
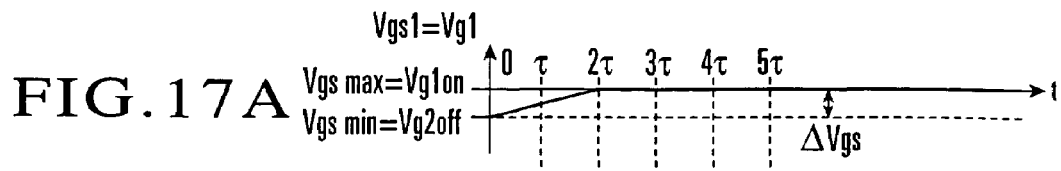
FIGS. 17A to 17F are waveform charts showing high-speed operation in the driver circuit disclosed in Japanese Patent Laid-Open No. 3-73917.
Figure 17B:
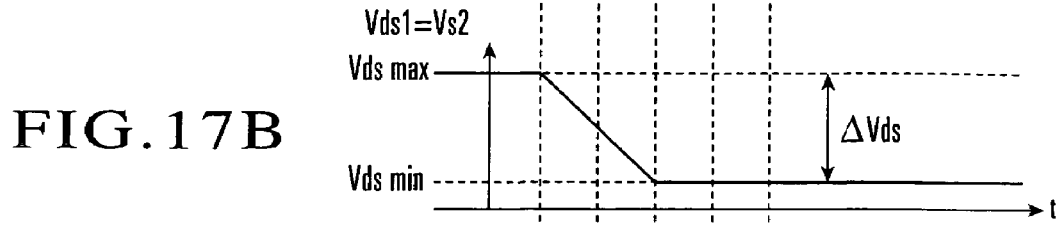
Figure 17C:
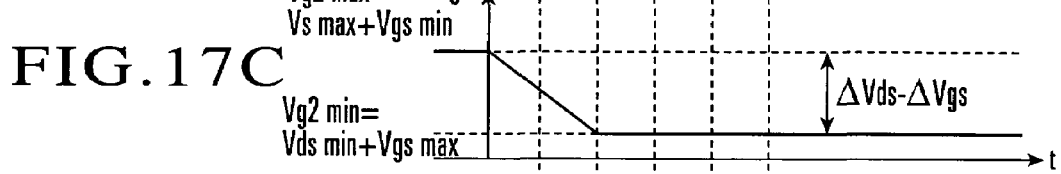
Figure 17D:
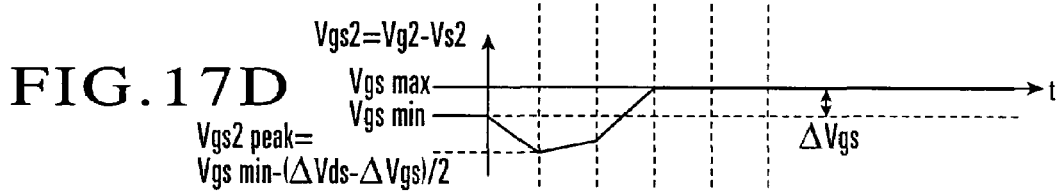
Figure 17E:
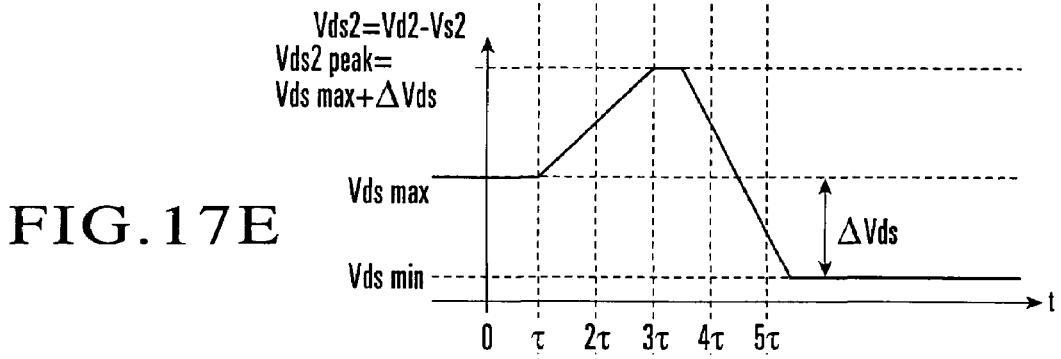
Figure 17F:
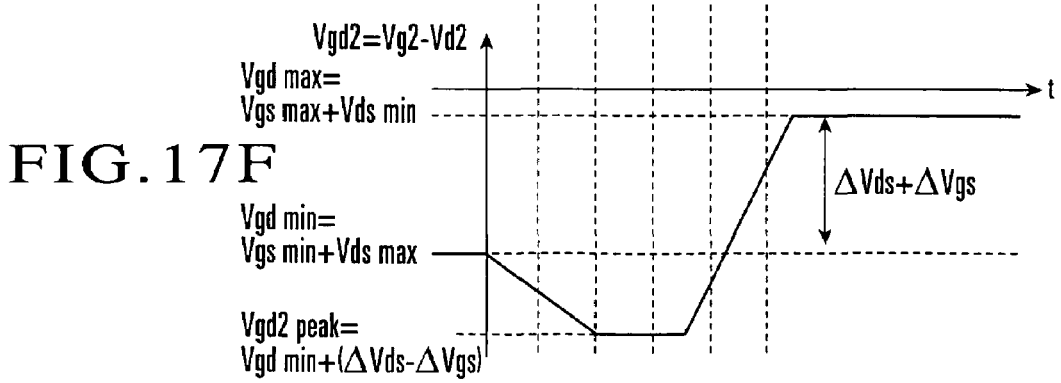

The circuit of FIG. 14 will be explained. Diodes D21 and D21' are inserted between the drain of T21 and the source of T22 and between the drain of T21' and the source of T22', respectively, with cathodes connected to the drains of T21 and T21' and anodes connected to the sources of T22 and T22'.

Diodes D31 and D31' are inserted between the drain of T31 and the source of T32 and between the drain of T31' and the source of T32', respectively, with cathodes connected to the drains of T31 and T31' and anodes connected to the sources of T32 and T32'.

Diodes D32 and D32' are inserted between the drain of T32 and the source of T33 and between the drain of T32' and the source of T33', respectively, with cathodes connected to the drains of T32 and T32' and anodes connected to the sources of T33 and T33'. Other portions of FIG. 14 are the same as those in the circuit shown in FIG. 9.

In the above-described embodiments of the present invention, all active elements are field effect transistors (FETs). The same arrangement can be implemented even with three-terminal active elements such as bipolar transistors.

In the above-described embodiment of the present invention, all the loads of three-terminal active elements are resistors. Since a power amplifier for a wireless system generally operates in a narrow band, the gain and output power can be often increased using complex impedances as loads. An arrangement in which complex impedances are arranged as loads to increase the gain and output power can also be exploited in the present invention.

What is claimed is:

1. A driver circuit comprising:
   first and second series-connected three-terminal active elements, each of said first and second three-terminal active elements having an amplification function and first, second, and third electrodes, the second and third electrodes of each three-terminal active element being series-connected between first and second potentials;
   first and second delay means which receive the same input signal; and
   an output load coupled to an end of the series-connected first and second three-terminal active elements, where the end is spaced apart from a node between the first and second series-connected three-terminal active elements,
   wherein outputs of said first and second delay means are respectively connected to the first electrodes of said first and second three-terminal active elements, the output from said first delay means has a phase that is inverse of a phase of the output from said second delay means, a delay amount of said second delay means is larger than a delay amount of said first delay means, the delay amount of said first delay means is a finite value including zero, and the difference of the delay amount of the first delay means and the second delay means is a fixed value, and wherein a temporal response of a potential difference between the second and third electrodes of the first three-terminal active element has a phase that is the same as a phase of the temporal response of the potential difference between the second and third electrodes of the second three-terminal active element.

2. The circuit according to claim 1, wherein said first delay means has a non-inverting signal function and said second delay means has a signal inverting function.

3. The circuit according to claim 2, wherein said second delay means is formed from a three-terminal active element of the same type as said first and second three-terminal active elements.

* * * * *